(12) United States Patent
Wang et al.

(10) Patent No.: US 12,212,266 B2
(45) Date of Patent: Jan. 28, 2025

(54) POWERTRAIN, COOLANT FLOW RATE ESTIMATION METHOD, AND ELECTRIC VEHICLE

(71) Applicant: Huawei Digital Power Technologies Co., Ltd., Shenzhen (CN)

(72) Inventors: Jiangang Wang, Dongguan (CN); Jiyang Li, Dongguan (CN); Wen Ye, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 407 days.

(21) Appl. No.: 17/858,812

(22) Filed: Jul. 6, 2022

(65) Prior Publication Data

US 2022/0352842 A1 Nov. 3, 2022

(30) Foreign Application Priority Data

Jul. 7, 2021 (CN) .......................... 202110769355.7

(51) Int. Cl.
*H02P 29/68* (2016.01)
*B60L 3/00* (2019.01)
(Continued)

(52) U.S. Cl.
CPC .............. *H02P 29/68* (2016.02); *B60L 3/003* (2013.01); *B60L 3/0061* (2013.01); *B60L 53/20* (2019.02);
(Continued)

(58) Field of Classification Search
CPC .......... H02P 29/68; H02P 27/06; B60L 3/003; B60L 3/0061; B60L 53/20;
(Continued)

(56) References Cited

U.S. PATENT DOCUMENTS 10,272,767 B1 4/2019 Tang et al.
2009/0099791 A1* 4/2009 Zettel .................... G01F 1/6965
702/45
(Continued)

FOREIGN PATENT DOCUMENTS

CN 108548570 A 9/2018
CN 110614919 A 12/2019
(Continued)

OTHER PUBLICATIONS

JP-2016097861-A_translate (Year: 2016).*
JP-2013031365-A_translate (Year: 2013).*
CN-111347928-A_translate (Year: 2020).*

*Primary Examiner* — Tulsidas C Patel
*Assistant Examiner* — Mohammed Ahmed Qureshi
(74) *Attorney, Agent, or Firm* — Leydig, Voit & Mayer, Ltd.

(57) ABSTRACT

A powertrain, a coolant flow rate estimation method, and an electric vehicle are provided. Coolant in a first cooling loop of the powertrain is configured to cool an inverter. An electronic pump drives the coolant to circulate in the first cooling loop. When a phase current of a motor is greater than or equal to a preset current value, a controller determines a rotation speed of the electronic pump at a first moment as a first rotation speed, and determines a coolant flow rate at the first moment based on a temperature at a first position in the first cooling loop, a temperature at a second position in the inverter, and a power loss of the inverter. In the solution of this application, data does not need to be separately calibrated for different thermal management systems. This reduces time consumed by data calibration and improves practicability.

20 Claims, 12 Drawing Sheets

(51) Int. Cl.
*B60L 53/20* (2019.01)
*H02K 7/14* (2006.01)
*H02K 9/19* (2006.01)
*H02P 27/06* (2006.01)
*H05K 7/20* (2006.01)

(52) U.S. Cl.
CPC ................ *H02K 7/14* (2013.01); *H02K 9/19* (2013.01); *H02P 27/06* (2013.01); *H05K 7/20272* (2013.01); *H05K 7/20927* (2013.01); *H05K 7/20945* (2013.01); *B60L 2240/429* (2013.01); *B60L 2240/525* (2013.01)

(58) Field of Classification Search
CPC ......... B60L 2240/429; B60L 2240/525; H05K 7/20272; H05K 7/20927; H05K 7/20945
See application file for complete search history.

(56) References Cited

U.S. PATENT DOCUMENTS

| | | |
|---|---|---|
| 2016/0226421 A1 | 8/2016 | Kadry et al. |
| 2017/0033722 A1* | 2/2017 | Ochs ................ H02P 27/085 |
| 2019/0223330 A1* | 7/2019 | Chen ................ H05K 7/20272 |
| 2021/0178902 A1 | 6/2021 | Liu et al. |

FOREIGN PATENT DOCUMENTS

| | | | |
|---|---|---|---|
| CN | 111347928 A | * | 6/2020 |
| CN | 210893273 U | | 6/2020 |
| CN | 107220414 B | | 1/2021 |
| JP | 2004082864 A | | 3/2004 |
| JP | 2013031365 A | * | 2/2013 |
| JP | 2013070466 A | | 4/2013 |
| JP | 2016097861 A | * | 5/2016 |
| JP | 2017180397 A | | 10/2017 |

* cited by examiner

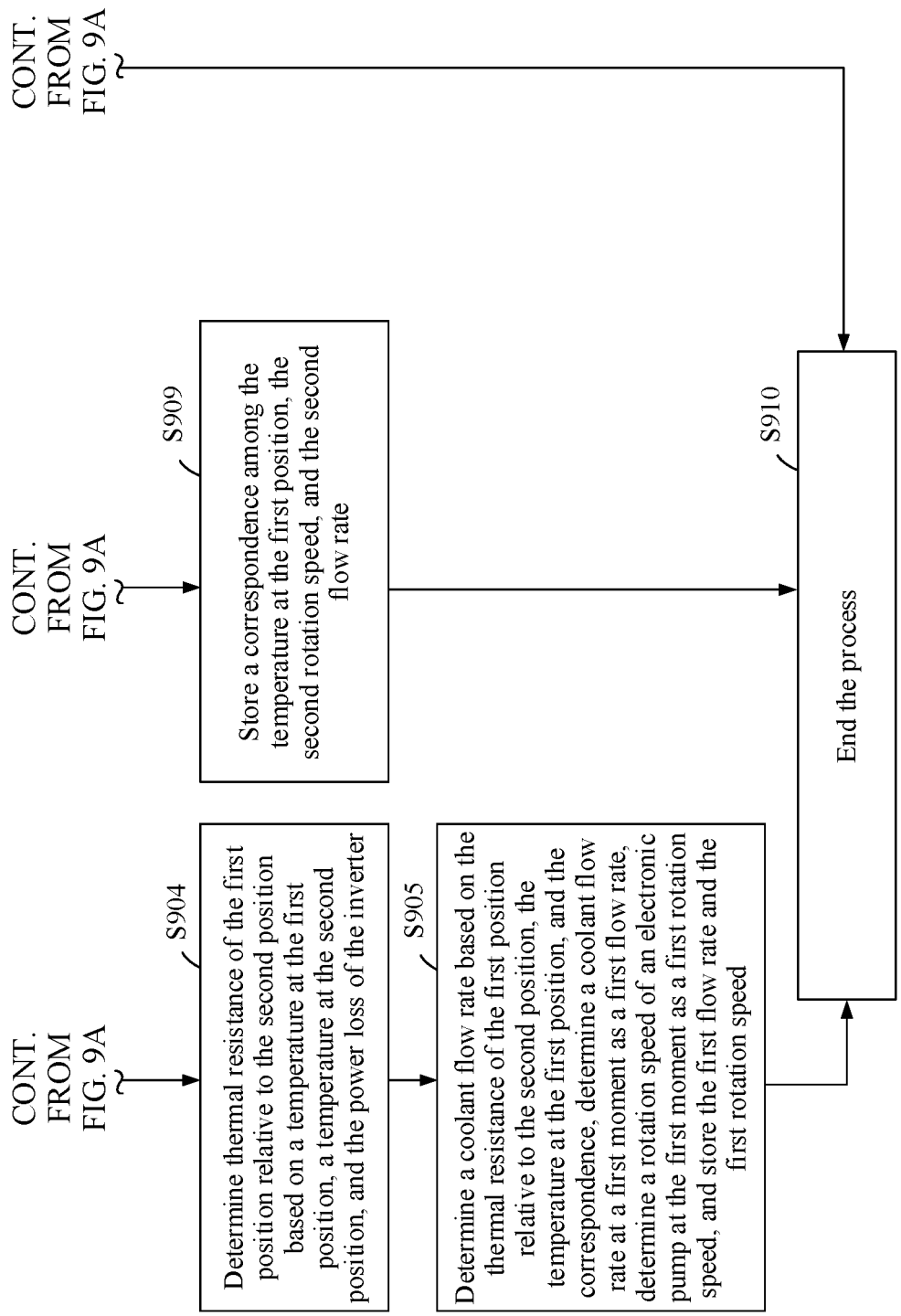

POWERTRAIN, COOLANT FLOW RATE ESTIMATION METHOD, AND ELECTRIC VEHICLE

CROSS-REFERENCE TO RELATED APPLICATIONS

This application claims priority to Chinese Patent Application No. 202110769355.7, filed on Jul. 7, 2021, which is hereby incorporated by reference in its entirety.

TECHNICAL FIELD

This application relates to the field of motor cooling technologies, and in particular, to a powertrain, a coolant flow rate estimation method, and an electric vehicle.

BACKGROUND

A powertrain of an electric vehicle includes a motor control unit (MCU), a motor, a reducer, and a cooling system. The MCU includes an inverter. The inverter may also be referred to as a direct current (DC)/alternating current (AC) converter, and is configured to convert a direct current provided by a power battery pack of the electric vehicle into an alternating current, and then provide the alternating current for the motor. The motor is configured to convert the alternating current into mechanical energy, and the motor needs to match the reducer to transfer the mechanical energy to wheels of the electric vehicle, to drive the electric vehicle. As a power transmission component, the reducer mainly includes components such as a gear, a bearing, and a housing. The cooling system is configured to cool the motor control unit, the motor, and the reducer.

With the evolution of the powertrain toward miniaturization, it is very important to estimate temperatures of the motor and MCU online and implement effective temperature control policies for vehicle safety. According to a current online temperature estimation manner, a coolant flow rate of the cooling system needs to be estimated and obtained, that is, accuracy of coolant flow rate estimation significantly affects accuracy of online temperature estimation.

For a powertrain shown in FIG. 1, a cooling system uses a water cooling loop 14 shown by dashed lines with arrows, and an oil cooling loop 15 shown by solid lines with arrows. The water cooling loop 14 is configured to cool an inverter 11, and the oil cooling loop 15 is configured to cool a motor 12 and a reducer 13. In existing coolant flow rate estimation, the coolant flow rate in the water cooling loop is estimated. First, a signal of a rotation speed of an electronic pump 18 and a signal of a temperature sensor are obtained. The signal of the temperature sensor is used to indicate a current coolant temperature in the water cooling loop. Then, a pre-calibrated correspondence among the rotation speed of the electronic pump, the coolant temperature, and the coolant flow rate is queried from a vehicle thermal management system, to obtain a corresponding coolant flow rate at this moment. However, due to differences between thermal management systems of different vehicle models, data calibration of a correspondence needs to be separately performed for different vehicle models for this manner. Consequently, data calibration is time-consuming, and practicability is poor.

SUMMARY

To resolve the foregoing problem, this application provides a powertrain, a coolant flow rate estimation method, and an electric vehicle, so that data calibration does not need to be separately performed for different thermal management systems. This reduces time consumed by data calibration and improves practicability.

According to a first aspect, this application provides a powertrain. The powertrain includes an inverter, a motor, an electronic pump, a first cooling loop, and a controller. Coolant in the first cooling loop is configured to cool the inverter. The electronic pump is configured to drive the coolant to circulate in the first cooling loop. The inverter is configured to output an alternating current to the motor. When a phase current of the motor is greater than or equal to a preset current value, the controller determines a rotation speed of the electronic pump at a first moment as a first rotation speed, and determines a coolant flow rate at the first moment based on a temperature at a first position in the first cooling loop, a temperature at a second position in the inverter, and a power loss of the inverter. When the phase current of the motor is less than the preset current value, the controller determines a rotation speed of the electronic pump at a second moment as a second rotation speed, and determines a coolant flow rate at the second moment based on the first rotation speed, the coolant flow rate at the first moment, and the second rotation speed.

The powertrain may estimate a current coolant flow rate in real time. Data for estimating the current coolant flow rate, that is, the temperature at the first position, the temperature at the second position, the power loss of the inverter, the rotation speed of the electronic pump, and the like, is data that can be determined on a powertrain side. Calibrated data on a thermal management system side does not need to be obtained. This avoids repeated calibration operations, reducing time overheads and improving practicability of a solution.

In addition, when the phase current of the motor is greater than or equal to the preset current value, heat dissipation power consumption of the inverter is high. In this case, impact of a relative error of temperature detection data is small. Therefore, the coolant flow rate is determined by using the temperature detection data in this application. When the phase current of the motor is less than the preset current value, heat dissipation power consumption of the inverter is low; and impact of a relative error of temperature detection data is large. In this case, in the solution of this application, a coolant flow rate in the case of low heat dissipation power consumption of the inverter is determined by using a coolant flow rate in the case of high heat dissipation power consumption of the inverter and a corresponding rotation speed of the electronic pump, and based on a current rotation speed of the electronic pump in the case of low heat dissipation power consumption of the inverter. This further improves accuracy of coolant flow rate estimation.

In a possible implementation, the controller determines thermal resistance between the first position and the second position based on the temperature at the first position, the temperature at the second position, and the power loss of the inverter, and determines the coolant flow rate at the first moment based on a correspondence among the thermal resistance between the first position and the second position, the temperature at the first position, and the coolant flow rate.

The correspondence among the thermal resistance between the first position and the second position, the temperature at the first position, and the coolant flow rate may be determined and stored in advance. In addition, data in a calibration process is data that can be determined on the powertrain side, and calibrated data on a thermal management system side does not need to be obtained. Therefore, a data calibration method may be applied to different thermal management systems, and has high practicability.

In a possible implementation, the first position is located at a coolant inlet in the first cooling loop. The second position is located at a position that is in the inverter and that is close to a coolant inlet side of the first cooling loop, and the second position is aligned with the first position in a direction perpendicular to the first cooling loop.

In this case, the temperature at the first position is a lowest temperature in the first cooling loop, and a temperature difference between the first position and the second position is relatively large. Therefore, a relative error of the temperature difference caused by a measurement error is small, that is, impact of the measurement error on a result of coolant flow rate calculation is reduced.

In a possible implementation, the controller determines the power loss of the inverter based on a bus voltage of the inverter, an output alternating current of the inverter, an operating temperature of a power semiconductor device in the inverter, and a duty cycle of a control signal of the inverter.

The bus voltage of the inverter, the output alternating current of the inverter, the operating temperature of the power semiconductor device in the inverter, and the duty cycle of the control signal of the inverter may all be obtained in real time.

In a possible implementation, when the phase current of the motor is less than the preset current value, the controller determines the coolant flow rate at the second moment based on a ratio of the first rotation speed to the coolant flow rate at the first moment, and the second rotation speed.

A ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

In a possible implementation, the controller includes a register, and the controller further stores a correspondence among the temperature at the first position, the second rotation speed, and the coolant flow rate at the second moment in the register. When the phase current of the motor is less than the preset current value again, the controller determines a coolant flow rate at a third moment based on a temperature at the first position at the third moment, a rotation speed of the electronic pump at the third moment, and the correspondence among the temperature at the first position, the second rotation speed, and the coolant flow rate at the second moment.

When the phase current of the motor is less than the preset current value again, the controller determines the temperature at the first position at the third moment as a first temperature, and determines the rotation speed of the electronic pump at the third moment as a third rotation speed. When the third rotation speed is equal to a second rotation speed included in the correspondence among the temperature at the first position, the second rotation speed, and the coolant flow rate at the second moment, a second flow rate corresponding to the second rotation speed equal to the third rotation speed is used as the coolant flow rate at the third moment.

As the powertrain works for longer time, the stored correspondence is continuously improved, so that coolant flow rates corresponding to different coolant temperatures and different rotation speeds of the electronic pump are calibrated. This can replace a method of proportional scaling of the rotation speed of the electronic pump, and improve accuracy of coolant flow rate estimation.

In a possible implementation, the powertrain further includes a memory. The controller stores a correspondence among the temperature at the first position, the second rotation speed, and the coolant flow rate at the second moment in the memory. When the phase current of the motor is less than the preset current value again, the controller determines a coolant flow rate at a third moment based on a temperature at the first position at the third moment, a rotation speed of the electronic pump at the third moment, and the correspondence among the temperature at the first position, the second rotation speed, and the coolant flow rate at the second moment.

When the phase current of the motor is less than the preset current value again, the controller determines the temperature at the first position at the third moment as a first temperature, and determines the rotation speed of the electronic pump at the third moment as a third rotation speed. When the third rotation speed is equal to a second rotation speed included in the correspondence among the temperature at the first position, the second rotation speed, and the coolant flow rate at the second moment, a second flow rate corresponding to the second rotation speed equal to the third rotation speed is used as the coolant flow rate at the third moment.

As the powertrain works for longer time, the stored correspondence is continuously improved, so that coolant flow rates corresponding to different coolant temperatures and different rotation speeds of the electronic pump are calibrated. This can replace a method of proportional scaling of the rotation speed of the electronic pump, and improve accuracy of coolant flow rate estimation.

In a possible implementation, the controller determines the temperature at the first position by using a first temperature sensor, or the controller determines the temperature at the first position based on temperature information sent by a vehicle control unit (VCU). In this case, the controller may be a motor control unit (MCU) and can communicate with the vehicle control unit.

In a possible implementation, the temperature at the second position is measured by using a temperature measurement device. The temperature measurement device is either one of the following: a thermistor or a second temperature sensor.

When the temperature measurement device is the thermistor, the thermistor may be classified into a positive temperature coefficient (PTC) thermistor and a negative temperature coefficient (NTC) thermistor based on different temperature coefficients.

In a possible implementation, the motor includes a current sensor. The current sensor is configured to detect the phase current of the motor, and send a detection result to the controller.

According to a second aspect, this application further provides another powertrain. The powertrain includes an inverter, a motor, an electronic pump, a first cooling loop, and a controller. Coolant in the first cooling loop is configured to cool the inverter. The electronic pump is configured to drive the coolant to circulate in the first cooling loop. The inverter is configured to output an alternating current to the motor. When a phase current of the motor is greater than a preset current value, the controller determines a rotation speed of the electronic pump at a first moment as a first rotation speed, and determines a coolant flow rate at the first moment based on a temperature at a first position in the inverter, a temperature at a second position in the inverter, a specific heat capacity of the coolant, density of the coolant, and a power loss of the inverter. When the phase current of the motor is less than the preset current value, the controller determines a rotation speed of the electronic pump at a second moment as a second rotation speed, and determines a coolant flow rate at the second moment based on the first rotation speed, the second rotation speed, and the coolant flow rate at the first moment.

The powertrain may estimate a current coolant flow rate in real time. Data for estimating the current coolant flow rate, that is, the temperature at the first position, the temperature at the second position, the specific heat capacity of the coolant, the density of the coolant, the power loss of the inverter, the rotation speed of the electronic pump, and the like, is data that can be determined on a powertrain side. Calibrated data on a thermal management system side does not need to be obtained. This avoids repeated calibration operations, reducing time overheads and improving practicability of the solution.

In addition, when the phase current of the motor is greater than or equal to the preset current value, heat dissipation power consumption of the inverter is high. In this case, impact of a relative error of temperature detection data is small. Therefore, the coolant flow rate is determined by using the temperature detection data in this application. When the phase current of the motor is less than the preset current value, heat dissipation power consumption of the inverter is low; and impact of a relative error of temperature detection data is large. In this case, in the solution of this application, a coolant flow rate in the case of low heat dissipation power consumption of the inverter is determined by using a coolant flow rate in the case of high heat dissipation power consumption of the inverter and a corresponding rotation speed of the electronic pump, and based on a current rotation speed of the electronic pump in the case of low heat dissipation power consumption of the inverter. This further improves accuracy of coolant flow rate estimation.

In a possible implementation, the first position is located at a position that is in the inverter and that is close to an inlet side of the first cooling loop, and the second position is located at a position that is in the inverter and that is close to an outlet side of the first cooling loop.

In this case, the first position is far away from the second position, and a temperature difference between the first position and the second position is large. Therefore, a relative error of the temperature difference caused by the measurement error is small, that is, impact of the measurement error on a result of coolant flow rate estimation is reduced.

In a possible implementation, the powertrain further includes a first temperature sensor and a second temperature sensor. The first temperature sensor is configured to determine the temperature at the first position in the inverter, and the second temperature sensor is configured to determine the temperature at the second position.

In a possible implementation, the controller determines the power loss of the inverter based on a bus voltage of the inverter, an output alternating current of the inverter, an operating temperature of a power semiconductor device in the inverter, and a duty cycle of a control signal of the inverter.

In a possible implementation, when the phase current of the motor is less than the preset current value, the controller determines the coolant flow rate at the second moment based on a ratio of the first rotation speed to the coolant flow rate at the first moment, and the second rotation speed.

A ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

In a possible implementation, the controller further includes a register. The controller is further configured to store a correspondence among the temperature at the first position, the second rotation speed, and the coolant flow rate at the second moment in the register. When the phase current of the motor is less than the preset current value again, the controller is configured to determine a coolant flow rate at a third moment based on a temperature at the first position at the third moment, a rotation speed of the electronic pump at the third moment, and the correspondence among the temperature at the first position, the second rotation speed, and the coolant flow rate at the second moment.

When the phase current of the motor is less than the preset current value again, the controller determines the temperature at the first position at the third moment as a first temperature, and determines the rotation speed of the electronic pump at the third moment as a third rotation speed. When the third rotation speed is equal to a second rotation speed included in the correspondence among the temperature at the first position, the second rotation speed, and the coolant flow rate at the second moment, a second flow rate corresponding to the second rotation speed equal to the third rotation speed is used as the coolant flow rate at the third moment.

In a possible implementation, the powertrain further includes a memory. The controller stores a correspondence among the temperature at the first position, the second rotation speed, and the coolant flow rate at the second moment in the memory. When the phase current of the motor is less than the preset current value again, the controller determines a coolant flow rate at a third moment based on a temperature at the first position at the third moment, a rotation speed of the electronic pump at the third moment, and the correspondence among the temperature at the first position, the second rotation speed, and the coolant flow rate at the second moment.

When the phase current of the motor is less than the preset current value again, the controller determines the temperature at the first position at the third moment as a first temperature, and determines the rotation speed of the electronic pump at the third moment as a third rotation speed. When the third rotation speed is equal to a second rotation speed included in the correspondence among the temperature at the first position, the second rotation speed, and the coolant flow rate at the second moment, a second flow rate corresponding to the second rotation speed equal to the third rotation speed is used as the coolant flow rate at the third moment.

In a possible implementation, the motor includes a current sensor. The current sensor is configured to detect the phase current of the motor, and send a detection result to the controller.

According to a third aspect, an embodiment of this application further provides a coolant flow rate estimation method, applied to a powertrain. The powertrain includes an inverter, a motor, an electronic pump, and a first cooling loop. Coolant in the first cooling loop is configured to cool the inverter, the electronic pump is configured to drive the coolant to circulate in the first cooling loop, and the inverter is configured to output an alternating current to the motor. The coolant flow rate estimation method includes:

when a phase current of the motor is greater than or equal to a preset current value, determining a rotation speed of the electronic pump at a first moment as a first rotation speed, and determining a coolant flow rate at the first moment based on a temperature at a first position in the first cooling loop, a temperature at a second position in the inverter, and a power loss of the inverter; and when the phase current of the motor is less than the preset current value, determining a rotation speed of the electronic pump at a second moment as a second rotation speed, and determining a coolant flow rate at the second moment based on the first rotation speed, the coolant flow rate at the first moment, and the second rotation speed.

A current coolant flow rate may be estimated in real time by using the method. Data for estimating the current coolant flow rate, that is, the temperature at the first position, the temperature at the second position, the power loss of the inverter, the rotation speed of the electronic pump, and the like, is data that can be determined on a powertrain side. Calibrated data on a thermal management system side does not need to be obtained. This avoids repeated calibration operations, reducing time overheads and improving practicability of the solution.

In addition, when the phase current of the motor is greater than or equal to the preset current value, heat dissipation power consumption of the inverter is high. In this case, impact of a relative error of temperature detection data is small. Therefore, the coolant flow rate is determined by using the temperature detection data. When the phase current of the motor is less than the preset current value, heat dissipation power consumption of the inverter is low; and impact of a relative error of temperature detection data is large. In this case, a coolant flow rate in the case of low heat dissipation power consumption of the inverter is determined by using a coolant flow rate in the case of high heat dissipation power consumption of the inverter and a corresponding rotation speed of the electronic pump, and based on a current rotation speed of the electronic pump in the case of low heat dissipation power consumption of the inverter. This further improves accuracy of coolant flow rate estimation.

In a possible implementation, the determining a coolant flow rate at the first moment based on a temperature at a first position in the first cooling loop, a temperature at a second position in the inverter, and a power loss of the inverter includes:

determining thermal resistance between the first position and the second position based on the temperature at the first position, the temperature at the second position, and the power loss of the inverter; and determining the coolant flow rate at the first moment based on a correspondence among the thermal resistance between the first position and the second position, the temperature at the first position, and the coolant flow rate.

In a possible implementation, before the determining a coolant flow rate at the first moment based on a temperature at a first position in the first cooling loop, a temperature at a second position in the inverter, and a power loss of the inverter, the method further includes:

predetermining the correspondence among the thermal resistance between the first position and the second position, the temperature at the first position, and the coolant flow rate.

In a possible implementation, the method further includes:

determining the power loss of the inverter based on a bus voltage of the inverter, an output alternating current of the inverter, an operating temperature of a power semiconductor device in the inverter, and a duty cycle of a control signal of the inverter.

In a possible implementation, the determining the coolant flow rate at the first moment based on a correspondence among the thermal resistance between the first position and the second position, the temperature at the first position, and the coolant flow rate includes:

determining the coolant flow rate at the second moment based on a ratio of the first rotation speed to the coolant flow rate at the first moment, and the second rotation speed, where a ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

In a possible implementation, the method further includes:

storing a correspondence among the temperature at the first position, the second rotation speed, and the coolant flow rate at the second moment; and when the phase current of the motor is less than the preset current value again, determining a coolant flow rate at a third moment based on a temperature at the first position at the third moment, a rotation speed of the electronic pump at the third moment, and the correspondence among the temperature at the first position, the second rotation speed, and the coolant flow rate at the second moment.

According to a fourth aspect, an embodiment of this application further provides another coolant flow rate estimation method, applied to a powertrain. The powertrain includes an inverter, a motor, an electronic pump, and a first cooling loop. Coolant in the first cooling loop is configured to cool the inverter, the electronic pump is configured to drive the coolant to circulate in the first cooling loop, and the inverter is configured to output an alternating current to the motor. The coolant flow rate estimation method includes:

when a phase current of the motor is greater than a preset current value, determining a rotation speed of the electronic pump at a first moment as a first rotation speed, and determining a coolant flow rate at the first moment based on a temperature at a first position in the inverter, a temperature at a second position in the inverter, a specific heat capacity of the coolant, density of the coolant, and a power loss of the inverter; and when the phase current of the motor is less than the preset current value, determining a rotation speed of the electronic pump at a second moment as a second rotation speed, and determining a coolant flow rate at the second moment based on the first rotation speed, the second rotation speed, and the coolant flow rate at the first moment.

A current coolant flow rate may be estimated in real time by using the method. Data for estimating the current coolant flow rate, that is, the temperature at the first position, the temperature at the second position, the specific heat capacity of the coolant, the density of the coolant, the power loss of the inverter, the rotation speed of the electronic pump, and the like, is data that can be determined on a powertrain side. Calibrated data on a thermal management system side does not need to be obtained. This avoids repeated calibration operations, reducing time overheads and improving practicability of the solution.

In addition, when the phase current of the motor is greater than or equal to the preset current value, heat dissipation power consumption of the inverter is high. In this case, impact of a relative error of temperature detection data is small. Therefore, the coolant flow rate is determined by using the temperature detection data according to this method. When the phase current of the motor is less than the preset current value, heat dissipation power consumption of the inverter is low, and impact of a relative error of temperature detection data is large. In this case, according to this method, a coolant flow rate in the case of low heat dissipation power consumption of the inverter is determined by using a coolant flow rate in the case of high heat dissipation power consumption of the inverter and a corresponding rotation speed of the electronic pump, and based on a current rotation speed of the electronic pump in the case of low heat dissipation power consumption of the inverter. This further improves accuracy of coolant flow rate estimation.

In a possible implementation, the method further includes:
  determining the power loss of the inverter based on a bus voltage of the inverter, an output alternating current of the inverter, an operating temperature of a power semiconductor device in the inverter, and a duty cycle of a control signal of the inverter.

In a possible implementation, the determining a coolant flow rate at the second moment based on the first rotation speed, the second rotation speed, and the coolant flow rate at the first moment includes:
  determining the coolant flow rate at the second moment based on a ratio of the first rotation speed to the coolant flow rate at the first moment, and the second rotation speed, where a ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

In a possible implementation, the method further includes:
  storing a correspondence among the temperature at the first position, the second rotation speed, and the coolant flow rate at the second moment; and
  when the phase current of the motor is less than the preset current value again, determining a coolant flow rate at a third moment based on a temperature at the first position at the third moment, a rotation speed of the electronic pump at the third moment, and the correspondence among the temperature at the first position, the second rotation speed, and the coolant flow rate at the second moment.

According to a fifth aspect, this application further provides an electric vehicle. The electric vehicle includes the powertrain provided in the foregoing implementation, and further includes a power battery pack. The power battery pack is configured to supply electric energy to the powertrain, and the powertrain is configured to convert the electric energy provided by the power battery pack into mechanical energy to drive the electric vehicle. The powertrain may estimate a current coolant flow rate in real time. Data for estimating the current coolant flow rate is data that can be determined on a powertrain side. Calibrated data on a thermal management system side does not need to be obtained. This avoids repeated calibration operations, reducing time overheads and improving practicability of the solution.

BRIEF DESCRIPTION OF DRAWINGS

FIG. 9A and FIG. 9B are a flowchart of another coolant flow rate estimation method according to an embodiment of this application:

DESCRIPTION OF EMBODIMENTS

To make a person skilled in the art better understand the technical solutions provided in embodiments of this application, the following first describes application scenarios of the technical solutions provided in this application.

The solution provided in this application is used to estimate a coolant flow rate that is in a powertrain and that is used to cool an inverter. The powertrain may be a single-motor powertrain or a multi-motor powertrain. The inverter of the powertrain may be cooled by water or oil. This is not limited in embodiments of this application. For ease of description, the following provides descriptions with the powertrain being the single-motor powertrain and the inverter being cooled by water.

Figure 1:
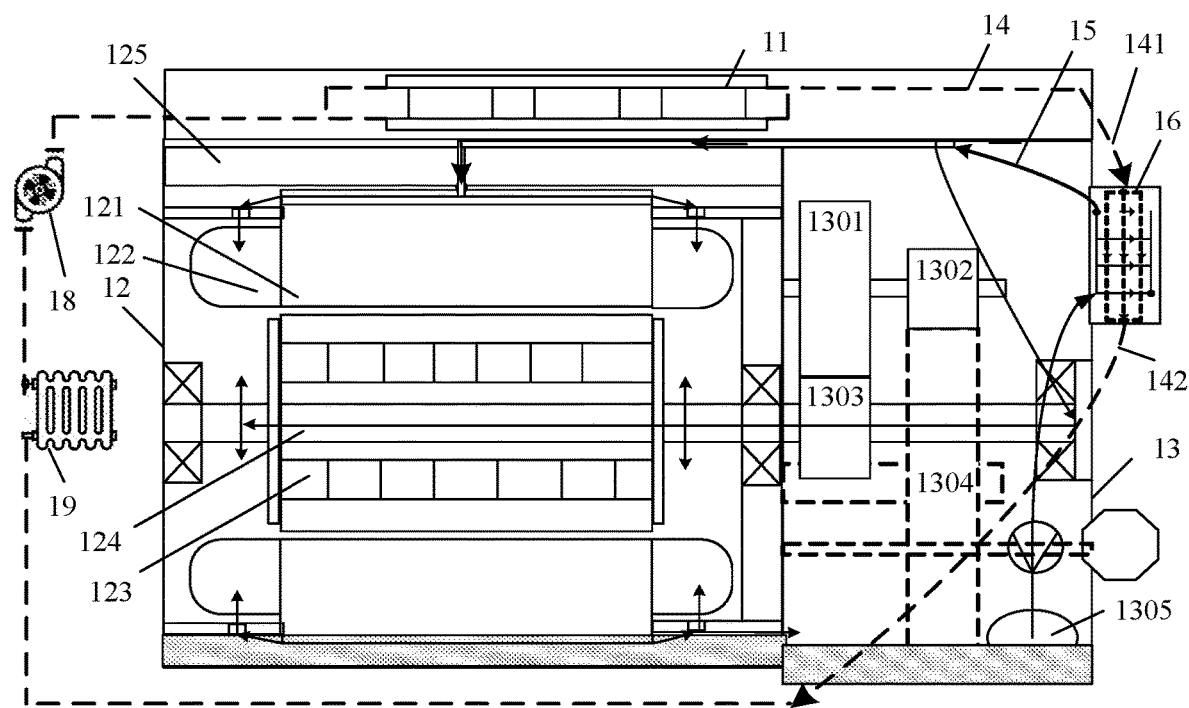
FIG. 1 is a schematic diagram of an existing powertrain.

FIG. 1 is a schematic diagram of an existing powertrain and a cooling system thereof.

The powertrain includes an inverter 11, a motor 12, and a reducer 13.

The inverter 11 is configured to convert a direct current provided by a power battery pack into an alternating current, and then provide the alternating current for the motor 12. The inverter 11 may be a three-phase three-level inverter or a three-phase two-level inverter. This is not limited in embodiments of this application.

The motor 12 includes a motor housing 125, a motor stator silicon steel sheet 121 and an end winding 122 that form a motor stator, and further includes a magnetic steel 123 and a motor rotating shaft 124 that form a motor rotor.

The reducer 13 includes a gear set configured to decelerate the motor 12. In some embodiments, the gear set includes a first intermediate shaft gear 1301, a second intermediate shaft gear 1302, an input shaft gear 1303, and an output shaft gear 1304, and further includes an oil filter 1305.

The cooling system of the powertrain includes a water cooling loop 14 (the loop shown by dashed lines with arrows in the figure), an oil cooling loop 15 (the loop shown by solid lines with arrows in the figure), and an oil-water heat exchanger 16. The water cooling loop 14 and the oil cooling loop 15 are not connected.

The water cooling loop 14 includes a water inlet pipe 141 and a water outlet pipe 142 that are connected to the oil-water heat exchanger 16. The water cooling loop 14 runs through the inverter 11, and runs through the oil-water heat exchanger 16 after heat dissipation is performed on the inverter 11.

The oil cooling loop 15 is configured to cool the motor 12 and the reducer 13.

The oil-water heat exchanger 16 includes a path belonging to the water cooling loop 14 and a path belonging to the oil cooling loop 15, and is configured to dissipate heat for the oil cooling loop 15 by using the water cooling loop 14, that is, secondary heat exchange is performed.

A motor control unit (not shown in the figure) controls the inverter 11 to convert a direct current into an alternating current. During this process, a part of energy is lost due to conversion efficiency, and this part of lost energy is converted into heat. At the same time, the alternating current enters the motor 12, and is converted into mechanical energy for rotation of the motor 12 by electromagnetic induction. In this process, thermal energy is also generated due to conversion efficiency. Finally, a high rotation speed of the motor 12 is decreased by the reducer 13, and heat is still generated during this process of conversion. The heat generated by the energy conversion in the above three processes needs to be discharged from the powertrain in time through the cooling system.

An inadequate cooling capability of the cooling system may result in shorter service lives of components of the powertrain, and even damages in serious cases. Therefore, it is of great importance to ensure the cooling capability of the cooling system. Currently, a coolant flow rate in the cooling system is generally used as a judgment basis. When the coolant flow rate is abnormal, it may be determined that the cooling system is faulty.

In addition, how to effectively estimate temperatures of a motor and an MCU online and execute an effective temperature control policy is very important to vehicle safety. According to a current manner of online temperature estimation, the coolant flow rate of the cooling system needs to be estimated and obtained, that is, accuracy of coolant flow rate estimation significantly affects accuracy of online temperature estimation. For example, when a flow rate error reaches 30%, an error of temperature estimation reaches 10° C.

To sum up, how to estimate the coolant flow rate accurately is of great significance to the safety of electric vehicles. In existing coolant flow rate estimation, the coolant flow rate in the water cooling loop is estimated. A specific type of the coolant is not limited in embodiments of this application. For example, in some embodiments, the coolant is a mixture of water and glycol. According to an existing estimation method, a rotation speed of an electronic pump 18 and a signal of a temperature sensor are obtained, and then a pre-calibrated correspondence among the rotation speed of the electronic pump, the temperature of the coolant, and the coolant flow rate is queried from the vehicle thermal management system, to obtain a corresponding coolant flow rate in this case.

However, due to differences between thermal management systems of different vehicle models, the thermal management systems of the different vehicle models differ in the foregoing correspondences. For example, for a same rotation speed of the electronic water pump and a same coolant temperature, coolant flow rates in the thermal management systems of the different vehicle models are different due to the differences between the thermal management systems. Therefore, calibration needs to be performed for a plurality of times for different vehicle models, resulting in high time overheads and poor practicability.

To resolve the foregoing problem, this application provides a powertrain, a coolant flow rate estimation method, and an electric vehicle. When a phase current of a motor is greater than or equal to a preset current value, a controller of the powertrain determines a rotation speed of an electronic pump at a first moment as a first rotation speed, and determines a coolant flow rate at the first moment based on a temperature at a first position in a first cooling loop, a temperature at a second position in an inverter, and a power loss of the inverter. When the phase current of the motor is less than the preset current value, the controller determines a rotation speed of the electronic pump at a second moment as a second rotation speed, and determines a coolant flow rate at the second moment based on the first rotation speed, the coolant flow rate at the first moment, and the second rotation speed. In this solution, data for estimating a current coolant flow rate is data that can be determined on a powertrain side. Calibrated data on a thermal management system side does not need to be obtained. Therefore, repeated calibration operations for different vehicle models are avoided in this solution, reducing time overheads and improving practicability of the solution, and impact of a relative error of temperature detection data is mitigated, improving accuracy of coolant flow rate estimation.

To make a person skilled in the art better understand the technical solutions in this application, the following describes the technical solutions in embodiments of this application with reference to the accompanying drawings in embodiments of this application.

Terms such as "first" and "second" in descriptions of this application are merely intended for a purpose of description, and shall not be understood as an indication or implication of relative importance or implicit indication of a quantity of indicated technical features.

In addition, in this application, terms of orientation such as "upper" and "lower" may be defined by, but are not limited to, orientations of components schematically placed in the accompanying drawings. It should be understood that these terms of orientation may be relative concepts, and are used for description and clarification of "relative", and may change correspondingly according to a change of an orientation of a component in the drawings.

In this application, unless otherwise clearly specified and limited, a term "connection" should be understood in a broad sense. For example, a "connection" may be a fixed connection, a detachable connection, or an integrated structure, may be a direct connection, or may be an indirect connection through an intermediary.

In the following descriptions of this application, for ease of description, a "loop" is used to replace a "pipeline" in a physical structure or a container that can carry cooling oil; and in a corresponding reference accompanying drawing, a line (dashed line or solid line) with an arrow is used to represent the "loop".

The flow rate is an amount of fluid flowing through an effective section of an enclosed pipeline in unit time, which is also known as an instantaneous flow: The amount of fluid expressed by volume is called a volume flow rate, and the amount of fluid expressed by mass is called a mass flow rate. This is not limited in the following embodiments of this application.

An embodiment of this application provides a powertrain of an electric vehicle. Details are described below with reference to the accompanying drawings.

Figure 2:
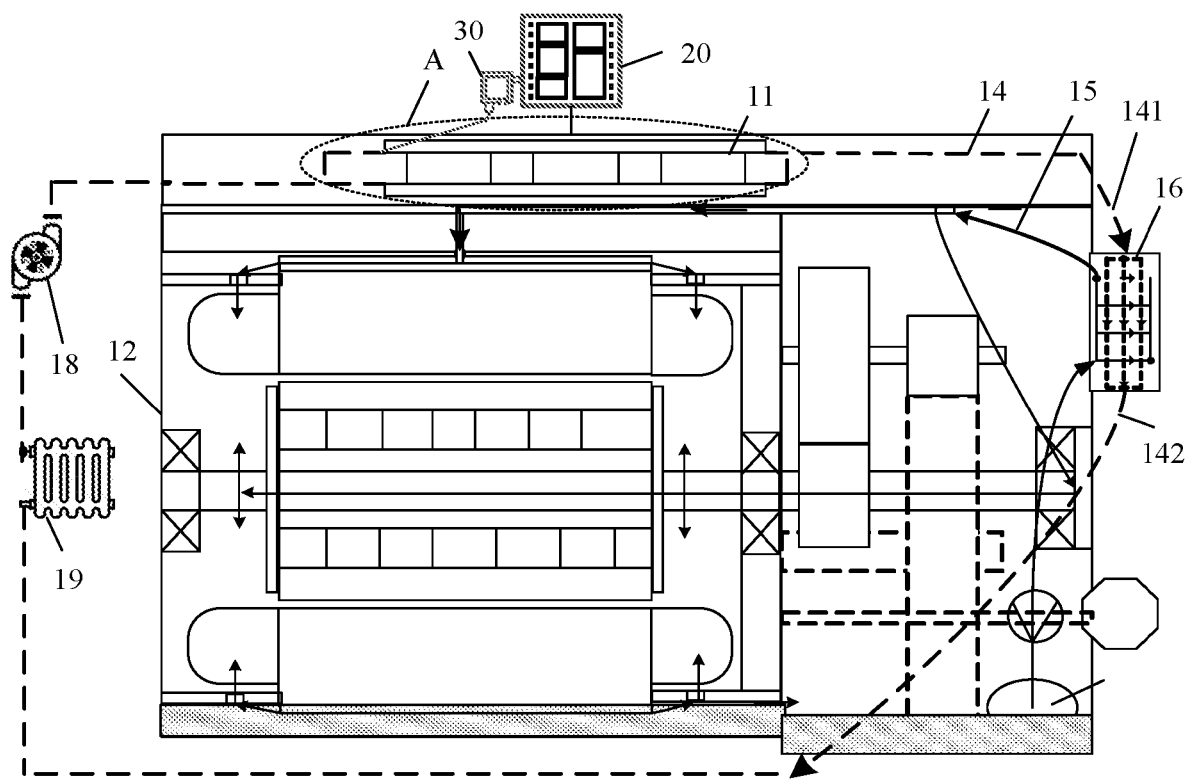
FIG. 2 is a schematic diagram of a powertrain according to an embodiment of this application.

FIG. 2 is a schematic diagram of a powertrain according to an embodiment of this application.

The powertrain of the electric vehicle shown in the figure includes an inverter 11, a motor 12, a controller 20, an electronic pump 18, and a first cooling loop (a water cooling loop part in an area A in a dashed box in the figure).

Coolant in the first cooling loop is configured to cool the inverter 11. The electronic pump 18 is configured to drive the coolant to circulate in the first cooling loop.

The inverter 11 converts a direct current provided by a power battery pack of the electric vehicle into an alternating current, and then provides the alternating current for the motor 12.

In some embodiments, the powertrain further includes a first temperature sensor 30, and the first temperature sensor 30 is configured to detect a temperature at a first position in the first cooling loop. The inverter 11 includes a temperature measurement device, and the temperature measurement device is disposed at a second position in the inverter 11. The temperature measurement device is electrically connected to a controller 20.

The electronic pump 18 is configured to drive the coolant to circulate in the first cooling loop, to cool the inverter 11. The electronic pump 18 in this embodiment of this application is controlled by a motor control unit (MCU).

The controller 20 may be an MCU, or may be disposed independently. This is not limited in this embodiment of this application. When the controller 20 is an MCU, the controller may further control a working status of the electronic pump 18.

The following describes a manner in which the controller determines a coolant flow rate in the first cooling loop. It may be understood that the coolant flow rate in the first cooling loop may also be understood as a coolant flow rate transmitted when the electronic pump 18 works.

The inverter 11 includes a power semiconductor device, and includes a diode, a power switch device, and the like. The power switch device may be an insulated gate bipolar transistor (IGBT), a metal-oxide-semiconductor field-effect transistor (MOSFET), a silicon carbide field-effect transistor (SiC MOSFET), or the like. This is not limited in this embodiment of this application. When the inverter 11 works, a power loss of the inverter 11 is mainly a power loss of the power semiconductor device, and the power loss of the inverter 11 is larger when the inverter 11 works in a larger current.

The motor 12 in this embodiment of this application is a three-phase motor, and a phase current of the motor 12 is a current flowing through a winding of each phase load of the motor. When the phase current of the motor 12 is greater than or equal to a preset current value, it indicates that the inverter 11 works at a large current in this case, and the temperature of the inverter 11 is relatively high. In this case, a current temperature at the second position obtained by the controller 20 by using the temperature measurement device is high, so that a relative error of temperature measurement at the second position is small. However, as the coolant in the first cooling loop cools the inverter 11, a coolant temperature gradually increases, so that a relative error of a measurement result of the first temperature sensor is reduced.

In this case, the controller 20 obtains a current temperature at the second position by using the temperature measurement device, and determines a current coolant flow rate based on the current temperature at the first position, the current temperature at the second position, and the power loss of the inverter.

When the phase current of the motor 12 is less than the preset current value, the inverter 11 works at a small current in this case, and the temperature of the inverter 11 is relatively low: Therefore, a current temperature at the second position obtained by the controller 20 by using the temperature measurement device is low; so that a relative error of temperature measurement at the second position is large. In addition, the relative error of the measurement result of the first temperature sensor is large. This increases an error of coolant flow rate estimation. Therefore, in this application, the coolant flow rate when the phase current of the motor 12 is less than the preset current value is estimated in a proportional scaling manner. Details are described below:

When the phase current of the motor 12 is greater than or equal to the preset current value, the controller 20 determines a coolant flow rate at a first moment as a first flow rate, and determines a rotation speed of the electronic pump 18 at the first moment as a first rotation speed.

When the phase current of the motor is less than the preset current value, the controller determines a current rotation speed of the electronic pump 18 as a second rotation speed. Because the rotation speed of the electronic pump 18 is proportional to the coolant flow rate, the controller may determine the current coolant flow rate based on the first rotation speed, the first flow rate, and the second rotation speed.

In some embodiments, a ratio of the first rotation speed to the first flow rate is equal to a ratio of the second rotation speed to a second flow rate.

In some other embodiments, the ratio of the first rotation speed to the first flow rate is a first ratio, and the ratio of the second rotation speed to the second flow rate is a second ratio. The first ratio and the second ratio are usually different to some extent, and this is caused by a data detection error. Therefore, a calibration coefficient may be calibrated in advance by performing an experiment on the powertrain, so that a product of the first ratio and the calibration coefficient is equal to the second ratio, to mitigate impact caused by the data detection error.

The controller 20 in this embodiment of this application is an application-specific integrated circuit (ASIC), a programmable logic device (PLD), a digital signal processor (DSP), or a combination thereof. The PLD may be a complex programmable logic device (CPLD), a field programmable gate array (FPGA), a generic array logic (GAL), or any combination thereof. This is not limited in this embodiment of this application.

The foregoing description uses an example in which the controller 20 obtains the temperature at the first position in the first cooling loop by using the first temperature sensor

30. In actual application, the controller 20 may alternatively receive temperature information sent by a vehicle control unit (VCU) of the electric vehicle, and determine the temperature of the first position based on the temperature information.

In conclusion, the current coolant flow rate can be estimated in real time by using the powertrain provided in this embodiment of this application. Data for estimating the current coolant flow rate, that is, the temperature at the first position, the temperature at the second position, the power loss of the inverter, the rotation speed of the electronic pump, and the like, is data that can be determined on a powertrain side. This avoids repeated calibration operations for different vehicle models, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

The following describes an implementation of estimating the coolant flow rate by the controller.

Figure 3:
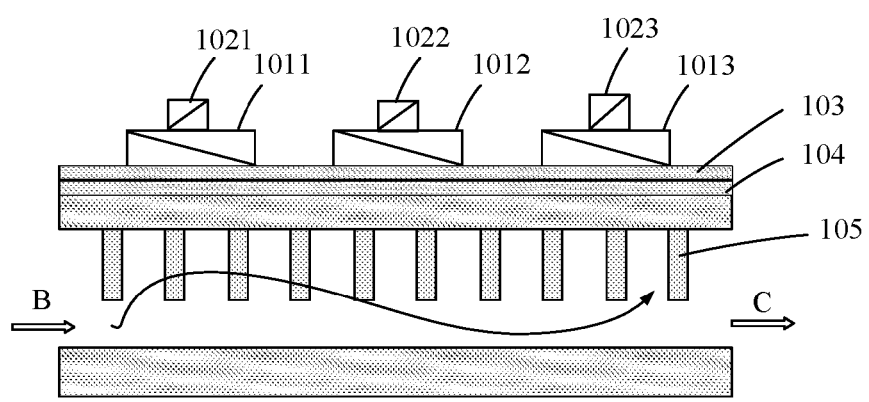
FIG. 3 is a schematic diagram of an inverter and a first cooling loop according to an embodiment of this application.

FIG. 3 is a schematic diagram of the inverter and the first cooling loop according to this embodiment of this application.

Power semiconductor device modules 1011 to 1013 are disposed on a printed circuit board (PCB) 103 of the inverter. Each power semiconductor device module correspondingly outputs a single-phase current needed by a motor, and each power semiconductor device module includes a power switch device and a diode.

The printed circuit board 103 performs auxiliary heat dissipation by using an auxiliary heat dissipation material 104. In some embodiments, the auxiliary heat dissipation material 104 is thermally conductive silicone grease. In addition, a radiator 105 is further disposed to increase a contact area with coolant and improve heat dissipation efficiency.

A temperature measurement device is correspondingly disposed on each power semiconductor device module. As shown in the figure, a temperature measurement device 1021 is disposed on the power semiconductor device module 1011, a temperature measurement device 1022 is disposed on the power semiconductor device module 1012, and a temperature measurement device 1023 is disposed on the power semiconductor device module 1013. In some embodiments, the temperature measurement device is a thermistor or a second temperature sensor.

When the temperature measurement device is the thermistor, the thermistor may be classified into a positive temperature coefficient (PTC) thermistor and a negative temperature coefficient (NTC) thermistor based on different temperature coefficients. The thermistor is typically characterized by temperature sensitivity, and has different resistance values at different temperatures. A positive temperature coefficient thermistor has a larger resistance value at a higher temperature, and a negative temperature coefficient thermistor has a smaller resistance value at a higher temperature. The controller may determine a current temperature of the thermistor, that is, determine a second temperature, based on a pre-calibrated correspondence between a resistance value and a temperature of the thermistor, and a current resistance value of the thermistor.

When the temperature measurement device is the second temperature sensor, the second temperature sensor is configured to detect a temperature at a second position and send a detection result to the controller.

As shown in the figure, a coolant inlet of the first cooling loop is B, and a coolant outlet is A.

A first temperature sensor of a powertrain is configured to detect a temperature at a first position in the first cooling loop. The controller obtains the temperature at the second position in the inverter by using the temperature measurement device.

The second position is not limited in this embodiment of this application. For example, when the second position is close to the coolant outlet of the first cooling loop, the temperature at the second position may be obtained by using the temperature measurement device 1023. For example, when the second position is close to the coolant inlet of the first cooling loop, the temperature at the second position may be obtained by using the temperature measurement device 1021.

An example in which the power switch device in the power semiconductor device is an IGBT is used for descriptions below. In the solution of this embodiment of this application, a thermal model of the power semiconductor device is used to calculate thermal resistance. First, a coolant temperature is obtained by using the first temperature sensor, then thermal resistance between the first position and the second position is determined, and then a coolant flow rate is determined based on a pre-calibrated correspondence among the thermal resistance, the coolant temperature, and the coolant flow rate.

When the correspondence is calibrated, a parameter of a rotation speed of an electronic pump of a vehicle thermal management system is not used in a calibration process. The thermal resistance is a parameter on a powertrain side, and is irrelevant to the vehicle thermal management system. This avoids repeated calibration operations for thermal management systems of different vehicle models. The following describes an implementation process of the solution of this application.

First, the correspondence among the thermal resistance, the coolant temperature, and the coolant flow rate is calibrated in advance through testing. The thermal resistance in this embodiment of this application is thermal resistance of the first position relative to the second position, may be understood as thermal resistance between the first position and the second position, or may be understood as thermal resistance of the second position relative to the first position.

Figure 4:
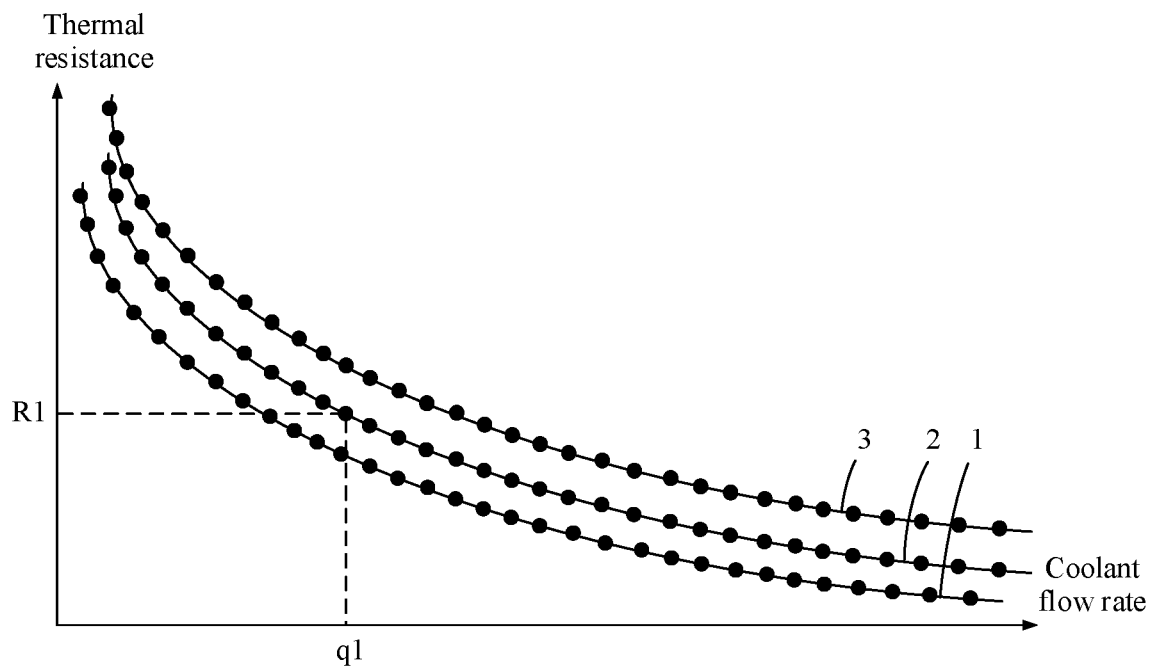
FIG. 4 is a curve of a correspondence among thermal resistance, a coolant temperature, and a coolant flow rate according to an embodiment of this application.

FIG. 4 is a curve of the correspondence among the thermal resistance, the coolant temperature, and the coolant flow rate according to this embodiment of this application.

A pre-calibration operation is performed, that is, an experiment is performed on the powertrain, to obtain a correspondence between the thermal resistance and the coolant flow rate at different coolant temperatures.

Data points in the figure indicate a correspondence between different thermal resistance and coolant flow rates at a current temperature. A range of the thermal resistance should cover a range of thermal resistance when the powertrain works normally. A range of the coolant flow rate should cover a range of the coolant flow rate that can be maintained when an electronic pump of the powertrain works. The foregoing data points are fitted into relationship curves. A temperature corresponding to a curve 1 is lower than a temperature corresponding to a curve 2, and the temperature corresponding to the curve 2 is lower than a temperature corresponding to a curve 3. That is, a higher temperature corresponds to a higher coolant flow rate under same thermal resistance.

In some embodiments, the first position may be located at the coolant inlet of the first cooling loop, and the second position is a position that is in the inverter and that is close to a coolant inlet side of the first cooling loop. The second position is aligned with the first position in a direction perpendicular to the first cooling loop. In this case, a temperature at the first position is a lowest temperature in the first cooling loop, and a temperature difference between the first position and the second position is relatively large. This mitigates impact of a temperature measurement error on thermal resistance calculation.

When the phase current of the motor is greater than or equal to the preset current value, it indicates that the inverter works at a large current in this case, and the temperature of the inverter is relatively high. In this case, the controller obtains a current temperature at the second position by using a temperature measurement device, obtains a temperature at the first position by using a first temperature sensor, and determines a current power loss of the inverter.

The following describes a process in which the controller determines the current power loss of the inverter. In the following descriptions of this embodiment of this application, the power loss of the inverter is mainly a power loss of a power semiconductor device.

The controller determines the power loss of the inverter based on a bus voltage of the inverter, an output alternating current of the inverter, an operating temperature of a power semiconductor device in the inverter, and a duty cycle of a control signal of the inverter. Details are described below.

Figure 5:
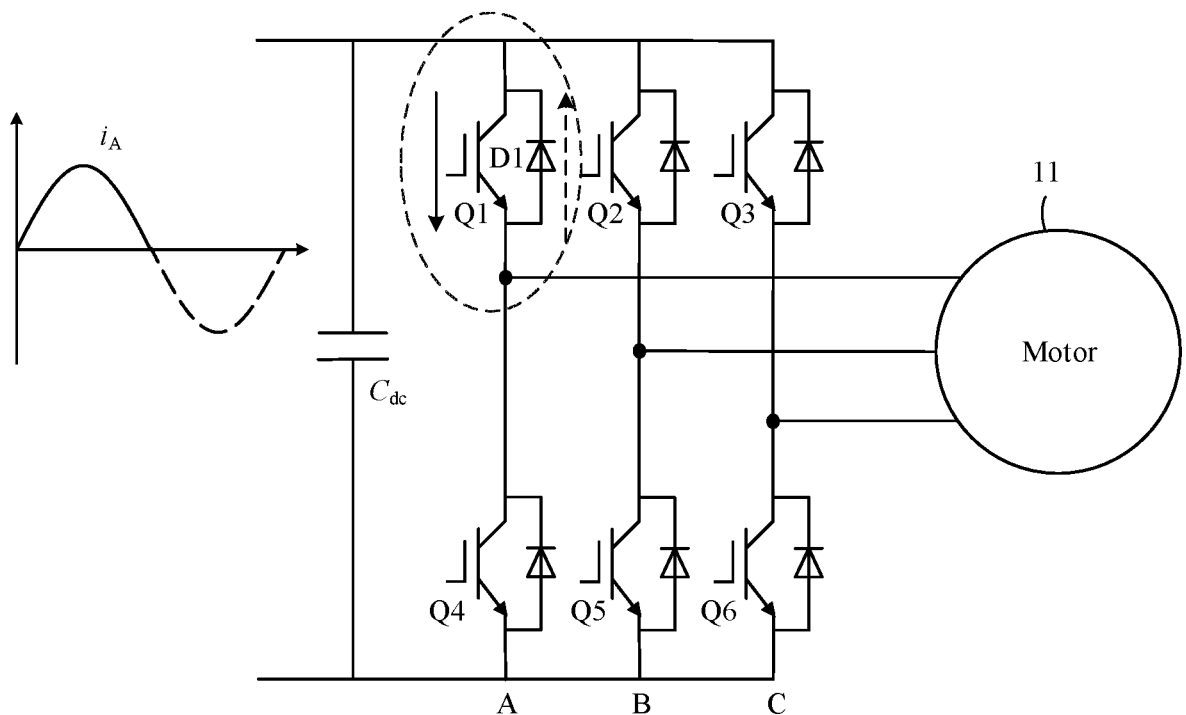
FIG. 5 is a schematic diagram of an inverter according to an embodiment of this application.

FIG. 5 is a schematic diagram of the inverter according to this embodiment of this application.

The inverter shown in the figure is a three-phase two-level inverter, and outputs three phases: A, B, and C. The following uses an example of determining a power loss of a power switch device Q1 of a bridge arm corresponding to phase A for description. A diode D1 anti-parallel to the Q1 may be an independently disposed diode, or may be a body diode of the Q1. This is not limited in this embodiment of this application. The following uses an example in which the power switch device is an IGBT for description.

When a phase-A current $i_A$ is in a positive half cycle, only the Q1 has a power loss, and the D1 remains switched off without loss. In this case, an on-state loss $P_{C1}$ of the Q1 is determined by using the following formula:

$$P_{C1} = V_{ON1} * Iq * D \quad (1)$$

$V_{ON1}$ is a conduction voltage drop of the Q1, and can be found in an IGBT manual according to a junction temperature of the Q1 and an on-state current Iq. Manual data may be entered and stored in a memory in advance, and invoked when being used. The junction temperature is an actual operating temperature of the Q1 of the inverter, and may be measured by a temperature sensor. For example, the operating temperature of the Q1 may be detected by using a second temperature sensor or a thermistor.

D is a duty cycle of a control signal of the Q1. When D is zero, it represents that the Q1 is in a default switch-on state in this case. When D is 1, it indicates that the Q1 is in a default switch-off state in this case.

A switching loss of the Q1 includes a conduction loss $P_{ON1}$ and a turn-off loss $P_{OFF1}$. The conduction loss $P_{ON1}$ is determined by using the following formula:

$$P_{ON1} = E_{ON1}/T_S \quad (2)$$

$E_{ON1}$ is a loss caused when the Q1 is switched on once, and can be found in the IGBT manual by using a current voltage of a direct current bus of the inverter, the junction temperature of the Q1, and the on-state current Iq. Ts is a current output cycle of the inverter.

The turn-off loss $P_{OFF1}$ is determined by the following formula:

$$P_{OFF1} = E_{OFF1}/T_S \quad (3)$$

$E_{OFF1}$ is a loss caused when the Q1 is switched off once, and can be found in the IGBT manual by using a current voltage of the direct current bus of the inverter, the junction temperature of the Q1, and the on-state current Iq.

In conclusion, a total power loss $P_1$ of the Q1 in the positive half cycle is determined by using the following formula:

$$P_1 = P_{C1} + P_{ON1} + P_{OFF1} \quad (4)$$

When the phase-A current $i_A$ is in a negative half cycle, only the D1 has a power loss, and the Q1 remains switched off without loss. In this case, an on-state loss $P_{D1}$ of the D1 is determined by using the following formula:

$$P_{D1} = V_{ON2} * Id * D \quad (5)$$

$V_{ON2}$ is a conduction voltage drop of the D1, and Id is a current flowing through the diode D1. D is the duty cycle of the control signal of the Q1.

A switching loss of the D1 includes a turn-off loss $P_{OFF2}$. The turn-off loss is caused by a reverse recovery process when the diode D1 is switched off, and the turn-off loss $P_{OFF2}$ is determined by using the following formula:

$$P_{OFF2} = E_{OFF2}/T_S \quad (6)$$

$E_{OFF2}$ is a loss caused when the D1 is switched off once, and can be found in the diode manual by using a current voltage of the direct current bus of the inverter, the junction temperature of the D1, and the on-state current Iq. Ts is a current output cycle of the inverter.

In conclusion, a total power loss $P_1$ of the D1 in the negative half cycle is determined by using the following formula:

$$P_1 = P_{D1} + P_{OFF2} \quad (7)$$

The power loss of one power switch device and the power loss of one diode are determined above, and the total power loss $P_{total}$ of the inverter may be determined with reference to a quantity of diodes and power switch devices in the inverter.

In some embodiments, the powertrain further includes a current sensor, to obtain Iq and Id above. The current sensor is configured to detect the phase current of the motor, and send a detection result to the controller.

After determining the power loss of the inverter, the controller determines a current temperature $T_1$ at the first position and a current temperature $T_2$ at the second position, and determines current thermal resistance R between the first position and the second position by using the following formula:

$$R = T_1 - T_2/P_{total} \quad (8)$$

Still refer to FIG. 4. After the thermal resistance R is determined, a curve of the correspondence between the thermal resistance and the coolant flow rate is determined based on the current temperature at the first position, and a corresponding coolant flow rate is determined based on the determined thermal resistance.

When the phase current of the motor is less than the preset current value, the inverter works at a small current in this case, and the temperature of the inverter is relatively low. In this application, a coolant flow rate when the phase current of the motor 12 is less than the preset current value is estimated in a proportional scaling manner. Details are described below. The preset current value is set based on an actual situation. This is not limited in this embodiment of this application.

First, when the phase current of the motor is greater than the preset current value, the coolant flow rate at the first moment is obtained as a first flow rate f1, the rotation speed of the electronic pump at the first moment is determined as a first rotation speed r1, and the first flow rate f1 and the first rotation speed r1 are used as references. When the phase current of the motor is less than the preset current value, a current rotation speed of the electronic pump is determined as a second rotation speed r2, and a current coolant flow rate f2 is determined based on the first rotation speed r1, the first flow rate f1, and the second rotation speed r2.

In a possible implementation, a ratio of the rotation speed of the electronic pump to the flow rate is a fixed value, that is, a ratio of the first rotation speed r1 to the first flow rate f1 is a first ratio, a ratio of the second rotation speed r2 to the second flow rate f2 is a second ratio, and the first ratio is equal to the second ratio. In this case, the coolant flow rate f2 is determined by using the following formula:

$$f_2 = \frac{r2}{r1} * f_1 \quad (9)$$

In another possible implementation, the first ratio and the second ratio are usually different to some extent, and this is caused by a data detection error. Therefore, a calibration coefficient may be calibrated in advance by performing an experiment on the powertrain, so that a product of the first ratio and the calibration coefficient is equal to the second ratio, to mitigate impact caused by the data detection error. In this case, the coolant flow rate f2 is determined by using the following formula:

$$f_2 = c * \frac{r2}{r1} * f_1 \quad (10)$$

c is the calibration coefficient, and the calibration coefficient c is calibrated in advance through an experiment.

In still another possible implementation, there is a preset function relationship between the ratio of the second rotation speed to the current coolant flow rate and the ratio of the first rotation speed to the first flow rate. The preset function relationship is shown in the following formula:

$$f_2 = [c_0 *(r2/r1)^0 + c_1 *(r2/r1)^1 + \ldots + c_k *(r2/r1)^k] * f_1 \quad (11)$$

k is a non-negative integer. $C_0, C_1, \ldots, C_k$, and the like are predetermined coefficients.

Figure 6:
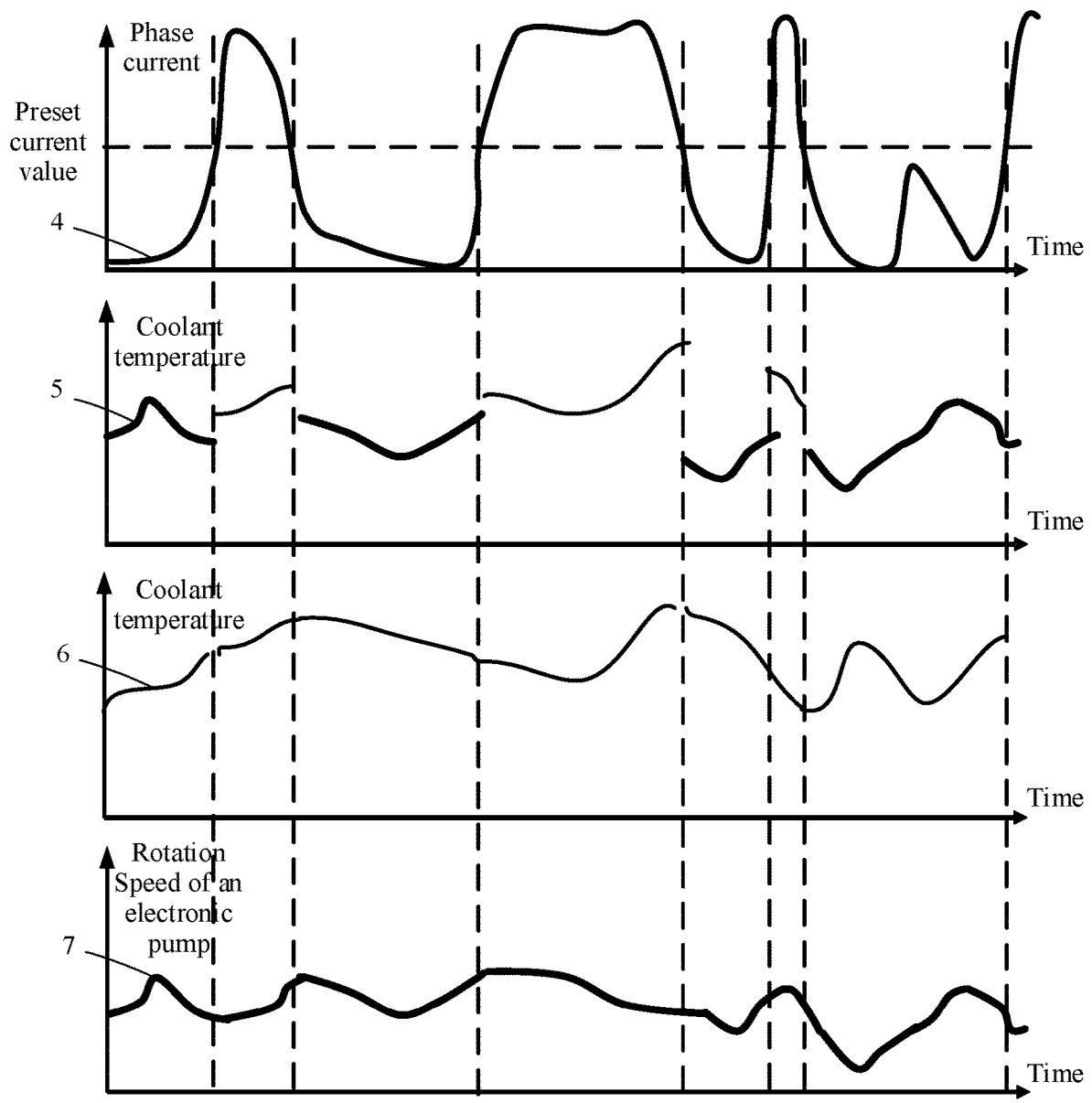
FIG. 6 is a schematic diagram of a correspondence between a coolant temperature and time according to an embodiment of this application.

FIG. 6 is a schematic diagram of a correspondence between the coolant temperature and time according to this embodiment of this application.

A mark of a correspondence between the phase current of the motor and the time is 4. A mark of a correspondence between the coolant temperature and the time that is finally determined in this embodiment of this application is 5. A mark of a correspondence between the coolant temperature and the time that is determined by using the thermal model of the power semiconductor device in an entire process is 6. A mark of a correspondence between the coolant temperature and the time that is determined by using proportional scaling of the rotation speed of the electronic pump in an entire process is 7.

When the phase current of the motor is less than the preset current value, the correspondence shown in 5 is the same as the correspondence shown in 7. When the phase current of the motor is greater than or equal to the preset current value, the correspondence shown in 5 is the same as the correspondence shown in 6.

In actual application, when the phase current of the motor is less than the preset current value, in a process of coolant flow rate estimation, a correspondence among the coolant temperature and the rotation speed of the electronic pump for each estimation, and the obtained coolant flow rate may be further stored. As the powertrain works for longer time, the stored correspondence is continuously improved. This implements calibration of coolant flow rates corresponding to different coolant temperatures and rotation speeds of the electronic pump. This replaces the method of proportional scaling of the rotation speed of the electronic pump, and improves accuracy of coolant flow rate estimation. Details are described below.

In a possible implementation, the controller includes a register. The register is some small storage areas used to store data in the controller, and is configured to store data participating in an operation and an operation result. When the phase current of the motor is less than the preset current value, after determining the second flow rate, the controller stores the correspondence among the temperature at the first position, the second rotation speed, and the second flow rate in the register. As the powertrain works for longer time, the correspondence stored in the register is continuously improved. The temperature at the first position represents the coolant temperature. This implements calibration of coolant flow rates corresponding to different coolant temperatures and rotation speeds of the electronic pump.

When the phase current of the motor is less than the preset current value again, a temperature at the first position at a third moment is determined as a first temperature, and a rotation speed of the electronic pump at the third moment is determined as a third rotation speed. The controller searches, according to the first temperature and the third rotation speed, the correspondence stored in the register for a corresponding coolant flow rate. When the third rotation speed at the first temperature is equal to a second rotation speed included in the correspondence, the second flow rate corresponding to the second rotation speed equal to the third rotation speed at the first temperature is used as a coolant flow rate at the third moment. This implements coolant flow rate estimation at the third moment, avoids the foregoing method of proportional scaling of the rotation speed of the electronic pump, and improves accuracy of coolant flow rate estimation.

It may be understood that, data in the correspondence stored in the register may be updated continuously as the powertrain works for longer time, and impact of an accidental error may be mitigated by using an average value method. For example, when a plurality of different coolant flow rates at a same first temperature and a same second rotation speed are obtained through estimation for a plurality of times, an average value of the obtained plurality of different coolant flow rates may be calculated, and a finally obtained average value of the coolant flow rates is used as the coolant flow rate corresponding to the first temperature and the second rotation speed.

In another possible implementation, the foregoing correspondence is stored in an independently disposed memory.

The controller is electrically connected to the memory, to implement storage and reading of the foregoing correspondence. Other descriptions are similar to those in the foregoing implementation, and details are not described herein again. The memory includes but is not limited to a phase-change memory (Phase-Change RAM, PRAM), a static random access memory (SRAM), a dynamic random access memory (DRAM), and another type of random access memory (RAM), or may be an electrically erasable programmable read-only memory (EEPROM).

In conclusion, the current coolant flow rate can be estimated in a real time and online manner by using the powertrain provided in this embodiment of this application. Data for estimating the current coolant flow rate, that is, the current temperature at the first position, the current temperature at the second position, and the power loss of the inverter, is data that can be determined on a powertrain side. Data on a vehicle thermal management system side does not need to be obtained. This avoids repeated calibration operations for different vehicle models, reducing time overheads and improving practicability of the solution. In addition, when the phase current of the motor is greater than or equal to the preset current value, the coolant flow rate is determined by using the temperature detection data. When the phase current of the motor is less than the preset current value, the current coolant flow rate is determined in a proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

An embodiment of this application further provides another powertrain, and another manner may be used to estimate a coolant flow rate. The following provides specific descriptions with reference to the accompanying drawings.

Figure 7:
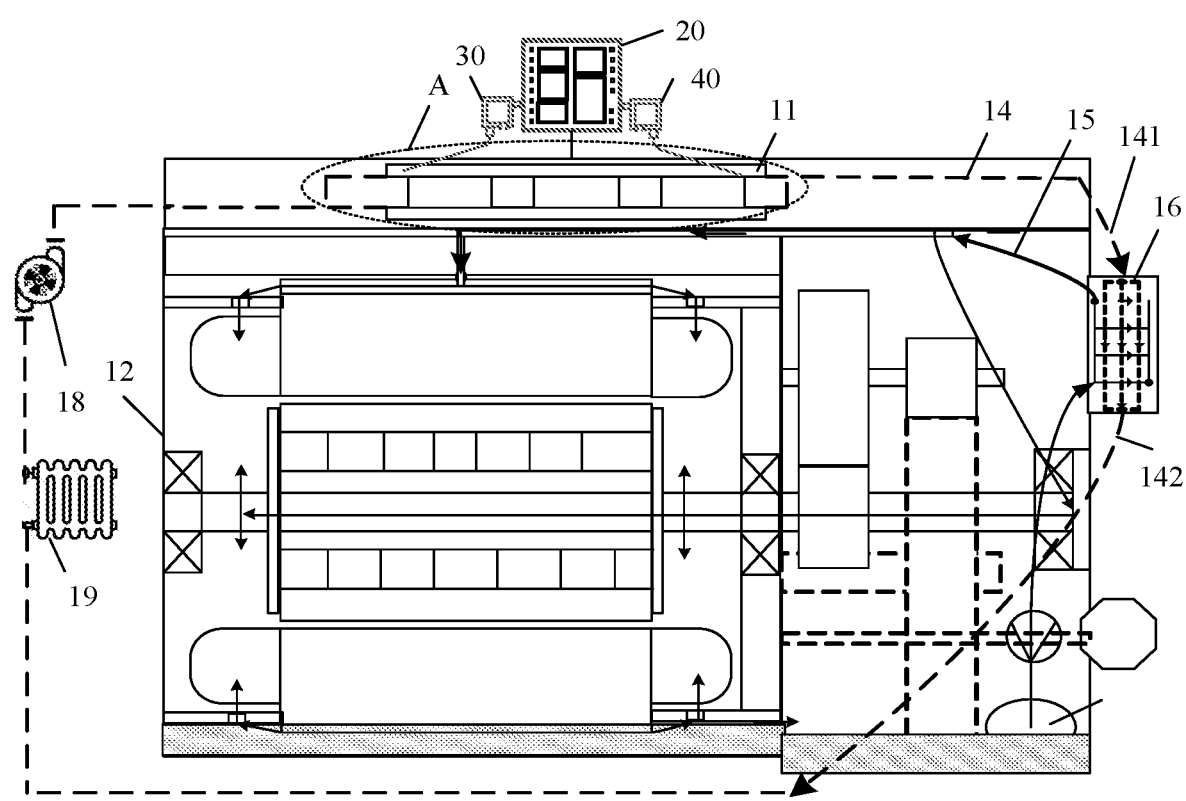
FIG. 7 is a schematic diagram of another powertrain according to an embodiment of this application.

FIG. 7 is a schematic diagram of another powertrain according to an embodiment of this application.

The powertrain of an electric vehicle shown in the figure includes an inverter 11, a motor 12, a controller 20, a first temperature sensor 30, a second temperature sensor 40, an electronic pump 18, and a first cooling loop (a water cooling loop part in an area A in a dashed box in the figure).

Coolant in the first cooling loop is configured to cool the inverter 11.

The motor 12 includes a current sensor (not shown in the figure). The current sensor is configured to detect a phase current of the motor, and send a detection result to the controller 20.

The first temperature sensor 30 is configured to detect a temperature at a first position in the inverter. The second temperature sensor is configured to detect a temperature at a second position in the inverter.

The electronic pump 18 is configured to drive the coolant to circulate in the first cooling loop, to cool the inverter 11. The electronic pump 18 in this embodiment of this application is controlled by a motor control unit (MCU).

The controller 20 may be an MCU, or may be disposed independently. This is not limited in this embodiment of this application. When the controller 20 is an MCU, the controller may further control a working status of the electronic pump 18.

The following describes a manner in which the controller determines a coolant flow rate in the first cooling loop. It may be understood that the coolant flow rate in the first cooling loop may also be understood as a coolant flow rate transmitted when the electronic pump 18 works.

Still refer to FIG. 3. In the solution of this embodiment of this application, the temperature measurement device of the inverter, that is, the temperature measurement devices 1021 to 1023 in the figure, may be reused. In this case, the temperature measurement device is the temperature sensor. For example, when the temperature measurement devices 1021 and 1022 are reused, the temperature measurement device 1021 is the first temperature sensor 30, and the temperature measurement device 1022 is the second temperature sensor 40. This avoids disposing a temperature sensor in the first cooling loop, reducing costs.

The motor in this embodiment of this application is a three-phase motor, and the phase current of the motor is a current flowing through a winding of each phase load of the motor. When the phase current of the motor is greater than or equal to a preset current value, it indicates that the inverter works at a large current in this case, and the temperature of the inverter is relatively high. In this case, a relative error between the temperature at the first position and the temperature at the second position that are obtained by the controller is small.

In this case, the controller determines the coolant flow rate in the first cooling loop based on the temperature at the first position, the temperature at the second position, a specific heat capacity of the coolant, density of the coolant, and a power loss of the inverter.

When the phase current of the motor is less than the preset current value, the inverter works at a small current in this case, and the temperature of the inverter is relatively low. Therefore, a relative error between the temperature at the first position and the temperature at the second position that are obtained by the controller is large. In this application, a coolant flow rate when the phase current of the motor is less than the preset current value is estimated in a proportional scaling manner. Details are described below.

When the phase current of the motor is greater than or equal to the preset current value, the controller determines a coolant flow rate at a first moment as a first flow rate, and determines a rotation speed of the electronic pump at the first moment as a first rotation speed.

When the phase current of the motor is less than the preset current value, the controller determines a current rotation speed of the electronic pump as a second rotation speed. Because the rotation speed of the electronic pump is proportional to the coolant flow rate, the controller may determine the current coolant flow rate based on the first rotation speed, the first flow rate, and the second rotation speed.

In some embodiments, a ratio of the first rotation speed to the first flow rate is equal to a ratio of the second rotation speed to a second flow rate.

In some other embodiments, the ratio of the first rotation speed to the first flow rate is a first ratio, and the ratio of the second rotation speed to the second flow rate is a second ratio. The first ratio and the second ratio are usually different to some extent, and this is caused by a data detection error. Therefore, a calibration coefficient may be calibrated in advance by performing an experiment on the powertrain, so that a product of the first ratio and the calibration coefficient is equal to the second ratio, to mitigate impact caused by the data detection error.

In conclusion, the current coolant flow rate can be estimated in real time by using the powertrain provided in this embodiment of this application. Data for estimating the current coolant flow rate, that is, the temperature at the first position, the temperature at the second position, the power loss of the inverter, the rotation speed of the electronic pump, the specific heat capacity of the coolant, the density of the coolant, and the like, is data that can be determined on a powertrain side. This avoids repeated calibration operations for different vehicle models, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

The following describes an implementation of estimating the coolant flow rate by the controller. In the following descriptions of this application, an example in which the flow rate is a volume flow rate is used for description, that is, the flow rate is a volume of fluid flowing through an effective section of an enclosed pipeline in unit time.

The controller determines the power loss of the inverter based on a bus voltage of the inverter, an output alternating current of the inverter, an operating temperature of a power semiconductor device in the inverter, and a duty cycle of a control signal of the inverter. For a specific implementation, refer to related descriptions in the foregoing embodiments, that is, the foregoing descriptions of formulas (1) to (7). Details are not described herein again in this embodiment.

When the phase current of the motor is less than the preset current value, P represents a power loss of the power semiconductor device, $T_1$ represents the temperature at the first position, $T_2$ represents the temperature at the second position, t represents time, $C_0$ represents the specific heat capacity of the coolant, $\rho$ represents the density of the coolant, $f_1$ represents the flow rate of the coolant, and Q represents heat absorbed by the coolant when the coolant cools an area between the first position and the second position, where this part of heat is also heat generated by the power loss of the power semiconductor device, and the following formula is satisfied:

$$Q = C_0 * \rho * f_1 * t * (T_2 - T_1) \qquad (12)$$

$$Q = P * t \qquad (13)$$

With reference to formulas (12) and (13), it may be determined that $f_1$ satisfies the following formula:

$$f_1 = \frac{P}{C_0 * \rho * (T_2 - T_1)} \qquad (14)$$

The specific heat capacity $C_0$ and the density $\rho$ of the coolant are inherent properties of the coolant, which are determined in advance based on the coolant type. For example, the first position is close to an inlet of the first cooling loop, and the second position is close to an outlet of the first cooling loop. In this case, the first temperature sensor is 1021, and the second temperature sensor is 1023. Because two temperature sensors that are far away from each other are selected, a difference between $T_2$ and $T_1$ is more obvious. This mitigates impact of a relative error on an estimation result during temperature measurement. In this case, P represents a total power loss of the power semiconductor device with all the power semiconductor device modules 1011 to 1013.

When the phase current of the motor is less than the preset current value, the inverter works at a small current in this case, and the temperature of the inverter is relatively low, so that the difference between $T_2$ and $T_1$ is not obvious. Consequently, the relative error during temperature measurement has large impact on the estimation result. In this application, a coolant flow rate when the phase current of the motor is less than the preset current value is estimated in a proportional scaling manner. Details are described below. The preset current value is set based on an actual situation. This is not limited in this embodiment of this application.

First, when the phase current of the motor is greater than the preset current value, the coolant flow rate at the first moment is obtained as a first flow rate f1, and the rotation speed of the electronic pump at the first moment is determined as a first rotation speed r1 according to the foregoing formulas (12) to (14), and the first flow rate f1 and the first rotation speed r1 are used as references. When the phase current of the motor is less than the preset current value, a current rotation speed of the electronic pump is determined as a second rotation speed r2, and a current coolant flow rate f2 is determined based on the first rotation speed r1, the first flow rate f1, and the second rotation speed r2.

In a possible implementation, a ratio of the rotation speed of the electronic pump to the flow rate is a fixed value, that is, a ratio of the first rotation speed r1 to the first flow rate f1 is a first ratio, a ratio of the second rotation speed r2 to the second flow rate f2 is a second ratio, and the first ratio is equal to the second ratio. In this case, the coolant flow rate f2 is determined according to the formula (9).

In another possible implementation, the first ratio and the second ratio are usually different to some extent, and this is caused by a data detection error. Therefore, a calibration coefficient may be calibrated in advance by performing an experiment on the powertrain, so that a product of the first ratio and the calibration coefficient is equal to the second ratio, to mitigate impact caused by the data detection error. In this case, the coolant flow rate f2 is determined according to the formula (10) or the formula (11).

In actual application, when the phase current of the motor is less than the preset current value, in a process of coolant flow rate estimation, a correspondence among the coolant temperature and the rotation speed of the electronic pump for each estimation, and the obtained coolant flow rate may be further stored. As the powertrain works for longer time, the stored correspondence is continuously improved. This implements calibration of coolant flow rates corresponding to different coolant temperatures and rotation speeds of the electronic pump. This replaces the method of proportional scaling of the rotation speed of the electronic pump, and improves accuracy of coolant flow rate estimation. Details are described below:

In a possible implementation, the controller includes a register. The register is some small storage areas used to store data in the controller, and is configured to store data participating in an operation and an operation result. When the phase current of the motor is less than the preset current value, after determining the second flow rate, the controller stores the correspondence among the temperature at the first position, the second rotation speed, and the second flow rate in the register. As the powertrain works for longer time, the correspondence stored in the register is continuously improved. The temperature at the first position represents the coolant temperature. This implements calibration of coolant flow rates corresponding to different coolant temperatures and rotation speeds of the electronic pump.

When the phase current of the motor is less than the preset current value again, a temperature at the first position at a third moment is determined as a first temperature, and a rotation speed of the electronic pump at the third moment is determined as a third rotation speed. The controller searches, according to the first temperature and the third rotation speed, the correspondence stored in the register for a corresponding coolant flow rate. When the third rotation speed at the first temperature is equal to a second rotation speed included in the correspondence, the second flow rate corresponding to the second rotation speed equal to the third rotation speed at the first temperature is used as a coolant flow rate at the third moment. This implements coolant flow rate estimation at the third moment, avoids the foregoing method of proportional scaling of the rotation speed of the electronic pump, and improves accuracy of coolant flow rate estimation.

It may be understood that, data in the correspondence stored in the register may be updated continuously as the powertrain works for longer time, and impact of an accidental error may be mitigated by using an average value method. For example, when a plurality of different coolant flow rates at a same first temperature and a same second rotation speed are obtained through estimation for a plurality of times, an average value of the obtained plurality of different coolant flow rates may be calculated, and a finally obtained average value of the coolant flow rates is used as the coolant flow rate corresponding to the first temperature and the second rotation speed.

In another possible implementation, the foregoing correspondence is stored in an independently disposed memory. The controller is electrically connected to the memory, to implement storage and reading of the foregoing correspondence. Other descriptions are similar to those in the foregoing implementation, and details are not described herein again.

In conclusion, repeated calibration operations for different vehicle models are avoided by using the powertrain provided in this embodiment of this application, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

Based on the powertrain of the electric vehicle provided in the foregoing embodiments, an embodiment of this application further provides a coolant flow rate estimation method. The following provides specific descriptions with reference to the accompanying drawings.

Figure 8:
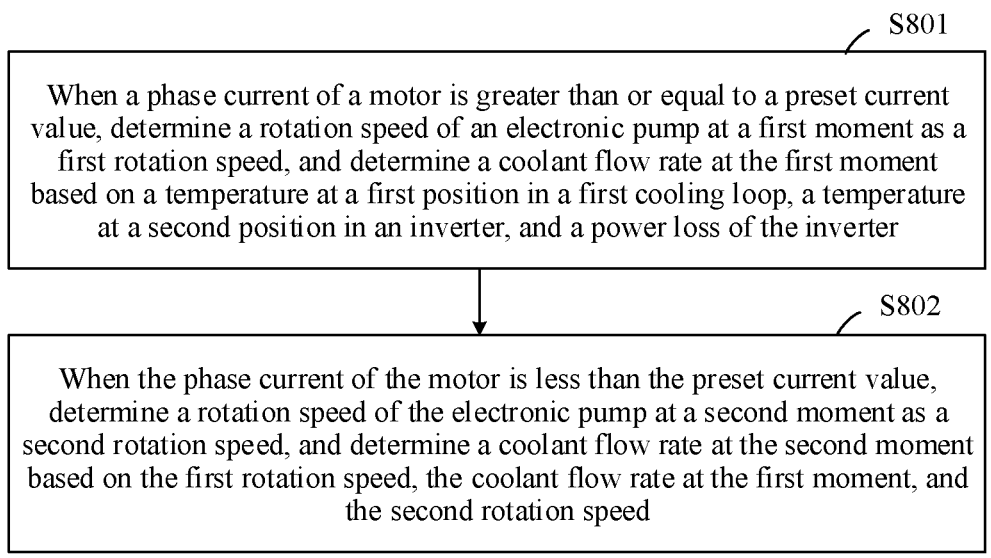
FIG. 8 is a flowchart of a coolant flow rate estimation method according to an embodiment of this application.

FIG. 8 is a flowchart of a coolant flow rate estimation method according to an embodiment of this application.

The method shown in the figure may be applied to the powertrain provided in the foregoing implementation embodiments, and the method includes the following steps.

S801: When a phase current of a motor is greater than or equal to a preset current value, determine a rotation speed of an electronic pump at a first moment as a first rotation speed, and determine a coolant flow rate at the first moment based on a temperature at a first position in a first cooling loop, a temperature at a second position in an inverter, and a power loss of the inverter.

S802: When the phase current of the motor is less than the preset current value, determine a rotation speed of the electronic pump at a second moment as a second rotation speed, and determine a coolant flow rate at the second moment based on the first rotation speed, the coolant flow rate at the first moment, and the second rotation speed.

According to the method provided in this embodiment of this application, the current coolant flow rate can be estimated in real time. Data for estimating the current coolant flow rate, that is, the temperature at the first position, the temperature at the second position, the power loss of the inverter, the rotation speed of the electronic pump, and the like, is data that can be determined on a powertrain side. This avoids repeated calibration operations for different vehicle models, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

The following provides description with reference to specific steps.

Figure 9A:
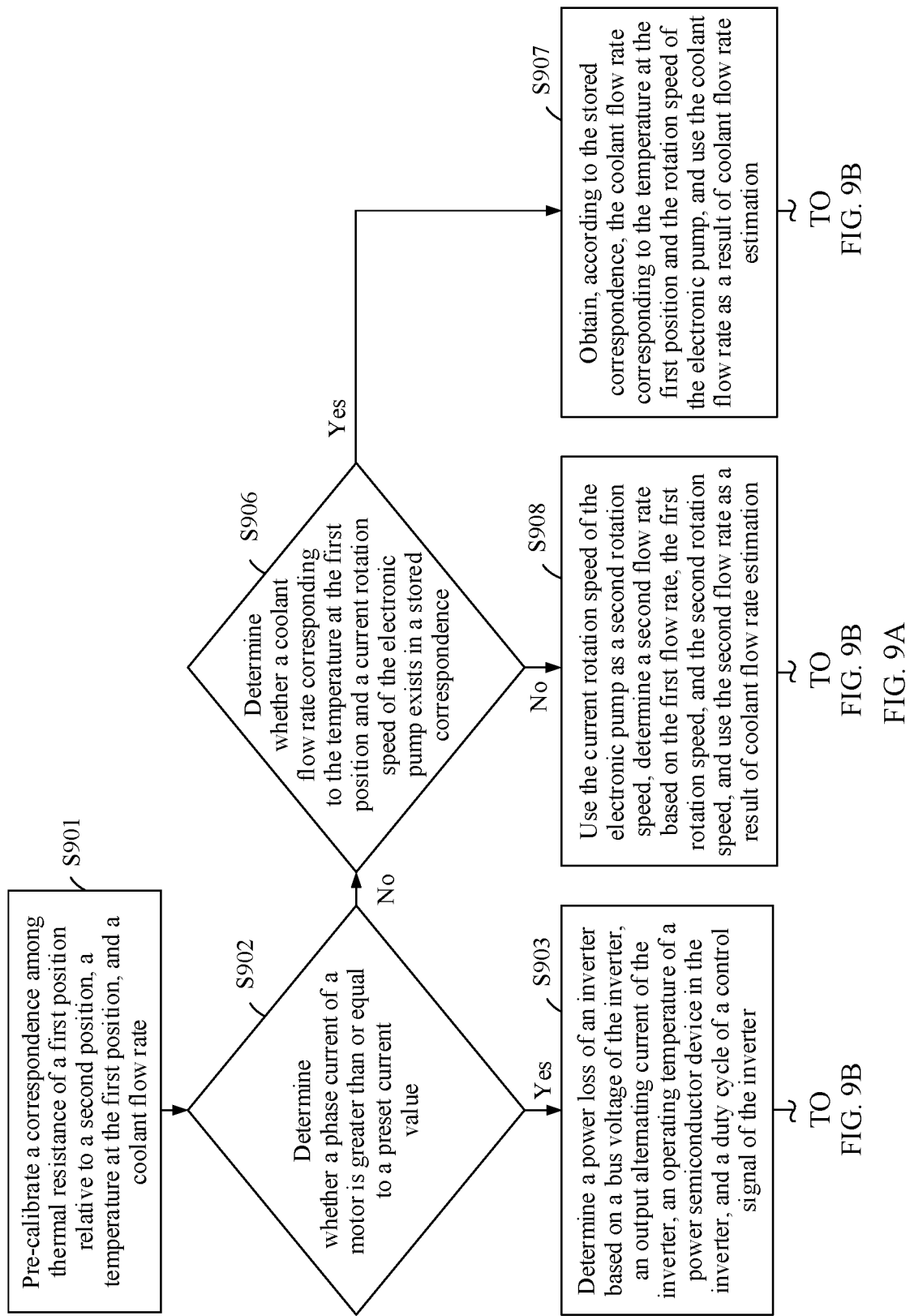

FIG. 9A and FIG. 9B are a schematic diagram of another coolant flow rate estimation method according to an embodiment of this application.

S901: Pre-calibrate a correspondence among thermal resistance of a first position relative to a second position, a temperature at the first position, and a coolant flow rate.

S902: Determine whether a phase current of a motor is greater than or equal to a preset current value.

If the phase current of the motor is greater than or equal to the preset current value, perform S903. If the phase current of the motor is less than the preset current value, perform S906.

S903: Determine a power loss of an inverter based on a bus voltage of the inverter, an output alternating current of the inverter, an operating temperature of a power semiconductor device in the inverter, and a duty cycle of a control signal of the inverter.

S904: Determine thermal resistance of the first position relative to the second position based on a temperature at the first position, a temperature at the second position, and the power loss of the inverter.

In some embodiments, the first position is located at a coolant inlet of a first cooling loop, and the second position is close to a coolant inlet side of the first cooling loop and aligned with the first position.

S905: Determine a coolant flow rate based on the thermal resistance of the first position relative to the second position, the temperature at the first position, and the correspondence, determine a coolant flow rate at a first moment as a first flow rate, determine a rotation speed of an electronic pump at the first moment as a first rotation speed, and store the first flow rate and the first rotation speed.

S906: Determine whether a coolant flow rate corresponding to the temperature at the first position and a current rotation speed of the electronic pump exists in a stored correspondence.

If a coolant flow rate corresponding to the temperature at the first position and the current rotation speed of the electronic pump exists in the stored correspondence, perform S907. If no coolant flow rate corresponding to a temperature at the first position and a current rotation speed of the electronic pump exists in the stored correspondence, perform S908.

S907: Obtain, according to the stored correspondence, the coolant flow rate corresponding to the temperature at the first position and the rotation speed of the electronic pump, and use the coolant flow rate as a result of coolant flow rate estimation.

S908: Use the current rotation speed of the electronic pump as a second rotation speed, determine a second flow rate based on the first flow rate, the first rotation speed, and the second rotation speed, and use the second flow rate as a result of coolant flow rate estimation.

A ratio of the first rotation speed to the first flow rate is a first ratio, and a ratio of the second rotation speed to the second flow rate is a second ratio.

In some embodiments, the first ratio is equal to the second ratio.

In some other embodiments, the first ratio and the second ratio are usually different to some extent, and this is caused by a data detection error. Therefore, a calibration coefficient may be calibrated in advance by performing an experiment on the powertrain, so that a product of the first ratio and the calibration coefficient is equal to the second ratio, to mitigate impact caused by the data detection error.

In some other embodiments, there is a preset function relationship between the ratio of the second rotation speed to the current coolant flow rate and the ratio of the first rotation speed to the first flow rate, and the second flow rate is determined according to the preset function relationship.

S909: Store a correspondence among the temperature at the first position, the second rotation speed, and the second flow rate.

The stored correspondence may be used for subsequent coolant flow rate estimation. That is, when the phase current of the motor is less than the preset current value again, a temperature at the first position at a third moment is determined as a first temperature, and a rotation speed of the electronic pump at the third moment is determined as a third rotation speed. When the third rotation speed at the first temperature is equal to a second rotation speed included in the correspondence, the second flow rate corresponding to the second rotation speed equal to the third rotation speed at the first temperature is used as a coolant flow rate at the third moment.

S910: End the process.

The following describes another coolant flow rate estimation method according to an embodiment of this application.

Figure 10:
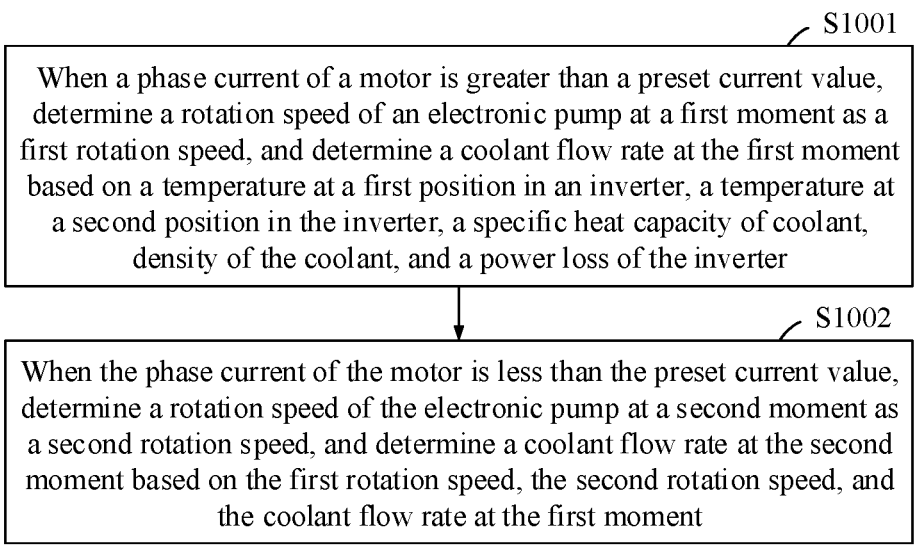
FIG. 10 is a flowchart of still another coolant flow rate estimation method according to an embodiment of this application.

FIG. 10 is a flowchart of still another coolant flow rate estimation method according to an embodiment of this application.

The method includes the following steps.

S1001: When a phase current of a motor is greater than a preset current value, determine a rotation speed of an electronic pump at a first moment as a first rotation speed, and determine a coolant flow rate at the first moment based on a temperature at a first position in an inverter, a temperature at a second position in the inverter, a specific heat capacity of coolant, density of the coolant, and a power loss of the inverter.

S1002: When the phase current of the motor is less than the preset current value, determine a rotation speed of the electronic pump at a second moment as a second rotation speed, and determine a coolant flow rate at the second moment based on the first rotation speed, the second rotation speed, and the coolant flow rate at the first moment.

According to the method provided in this embodiment of this application, the current coolant flow rate can be estimated in real time. Data for estimating the current coolant flow rate, that is, the temperature at the first position, the temperature at the second position, the power loss of the inverter, the rotation speed of the electronic pump, the specific heat capacity of the coolant, the density of the coolant, and the like, is data that can be determined on a powertrain side. This avoids repeated calibration operations for different vehicle models, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

The following provides description with reference to specific steps.

Figure 11A:
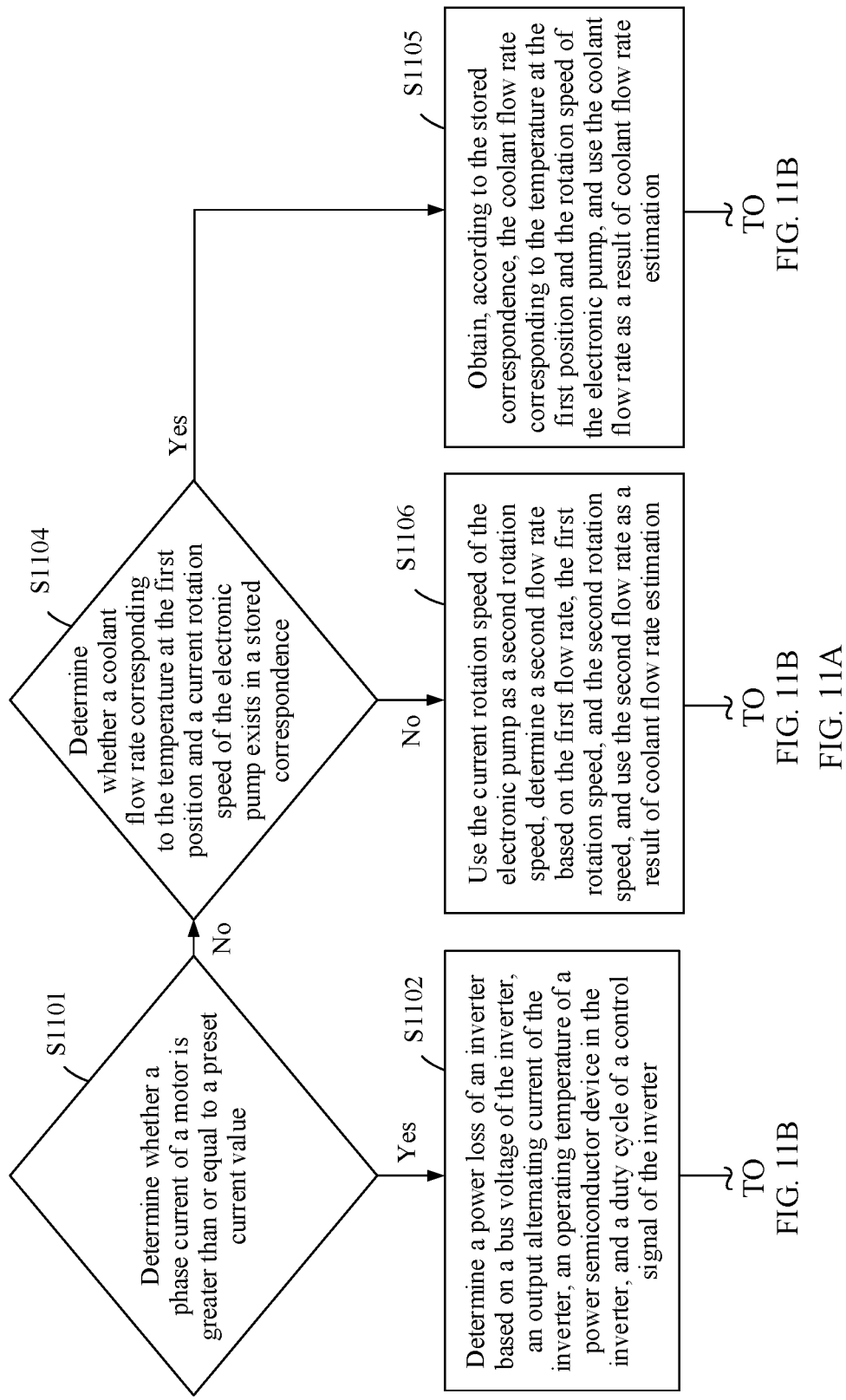
FIG. 11A and FIG. 11B are a flowchart of yet another coolant flow rate estimation method according to an embodiment of this application.
Figure 11B:
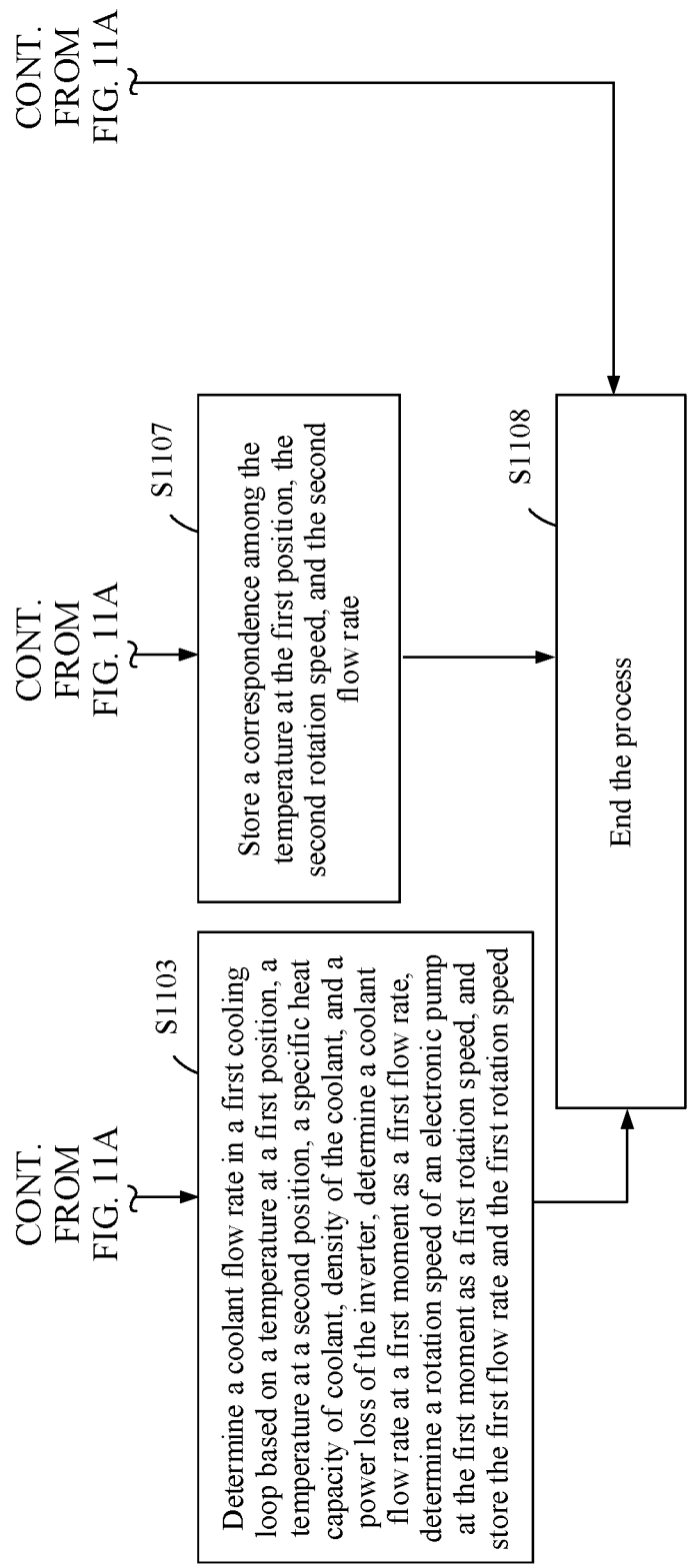

FIG. 11A and FIG. 11B are a flowchart of yet another coolant flow rate estimation method according to an embodiment of this application.

S1101: Determine whether a phase current of a motor is greater than or equal to a preset current value.

If the phase current of the motor is greater than or equal to the preset current value, perform S1102. If the phase current of the motor is less than the preset current value, perform S1104.

S1102: Determine a power loss of an inverter based on a bus voltage of the inverter, an output alternating current of the inverter, an operating temperature of a power semiconductor device in the inverter, and a duty cycle of a control signal of the inverter.

S1103: Determine a coolant flow rate in a first cooling loop based on a temperature at a first position, a temperature at a second position, a specific heat capacity of coolant, density of the coolant, and a power loss of the inverter, determine a coolant flow rate at a first moment as a first flow rate, determine a rotation speed of an electronic pump at the first moment as a first rotation speed, and store the first flow rate and the first rotation speed.

In some embodiments, the first position is close to an inlet of the first cooling loop, and the second position is close to an outlet of the first cooling loop.

S1104: Determine whether a coolant flow rate corresponding to the temperature at the first position and a current rotation speed of the electronic pump exists in a stored correspondence.

If a coolant flow rate corresponding to the temperature at the first position and the current rotation speed of the electronic pump exists in the stored correspondence, perform S1105. If no coolant flow rate corresponding to a temperature at the first position and a current rotation speed of the electronic pump exists in the stored correspondence, perform S1106. S1105: Obtain, according to the stored correspondence, the coolant flow rate corresponding to the temperature at the first position and the rotation speed of the electronic pump, and use the coolant flow rate as a result of coolant flow rate estimation.

S1106: Use the current rotation speed of the electronic pump as a second rotation speed, determine a second flow rate based on the first flow rate, the first rotation speed, and the second rotation speed, and use the second flow rate as a result of coolant flow rate estimation.

A ratio of the first rotation speed to the first flow rate is a first ratio, and a ratio of the second rotation speed to the second flow rate is a second ratio.

In some embodiments, the first ratio is equal to the second ratio.

In some other embodiments, the first ratio and the second ratio are usually different to some extent, and this is caused by an error during data detection. Therefore, a calibration coefficient may be calibrated in advance by performing an experiment on the powertrain, so that a product of the first ratio and the calibration coefficient is equal to the second ratio, to mitigate impact caused by the data detection error.

In some other embodiments, there is a preset function relationship between the ratio of the second rotation speed to the current coolant flow rate and the ratio of the first rotation speed to the first flow rate, and the second flow rate is determined according to the preset function relationship.

S1107: Store a correspondence among the temperature at the first position, the second rotation speed, and the second flow rate.

The stored correspondence may be used for subsequent coolant flow rate estimation. That is, when the phase current of the motor is less than the preset current value again, a temperature at the first position at a third moment is determined as a first temperature, and a rotation speed of the electronic pump at the third moment is determined as a third rotation speed. When the third rotation speed at the first temperature is equal to a second rotation speed included in the correspondence, the second flow rate corresponding to the second rotation speed equal to the third rotation speed at the first temperature is used as a coolant flow rate at the third moment.

S1108: End the process.

The steps in the foregoing methods are merely for ease of description, but do not constitute a limitation on the technical solutions of this application. A person skilled in the art may further properly adjust the steps in the foregoing methods and a sequence of the steps without departing from principles of this application, and the adjustment shall also fall within the protection scope of this application.

Based on the powertrain provided in the foregoing embodiments, an embodiment of this application further provides an electric vehicle to which the powertrain is applied. The following provides specific descriptions with reference to the accompanying drawing.

Figure 12:
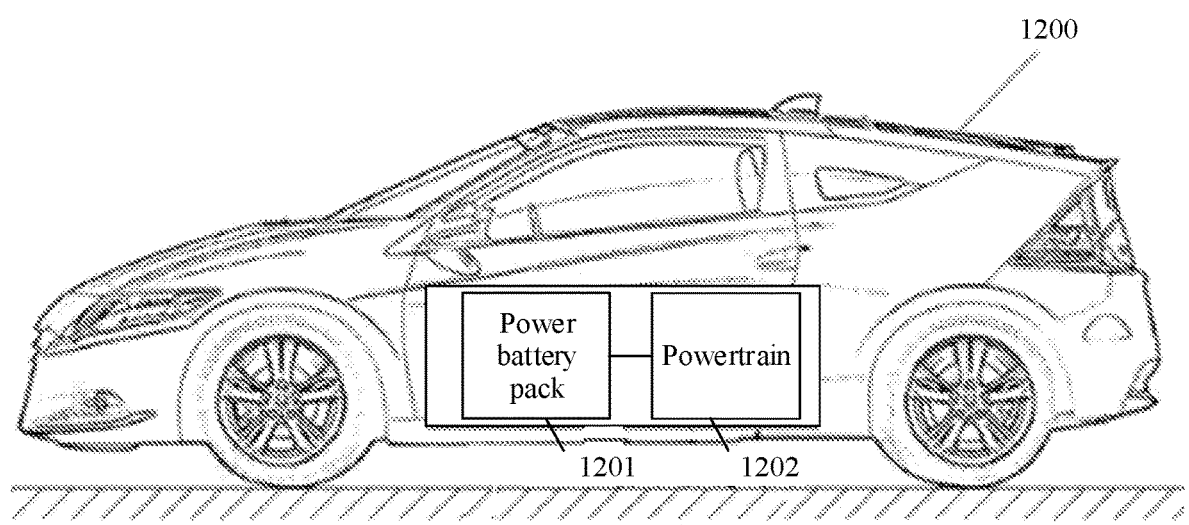
FIG. 12 is a schematic diagram of an electric vehicle according to an embodiment of this application.

FIG. 12 is a schematic diagram of an electric vehicle according to an embodiment of this application.

An electric vehicle 1200 provided in this embodiment of this application includes a power battery pack 1201 and a powertrain 1202.

The power battery pack 1201 is configured to provide electric energy for the powertrain 1202. The powertrain 1202 is configured to convert the electric energy provided by the power battery pack 1201 into mechanical energy to drive the electric vehicle.

The powertrain 1202 may be a single-motor powertrain or a multi-motor powertrain. This is not limited in this embodiment of this application.

A cooling system of the powertrain 1202 includes a water cooling loop, an oil cooling loop, and an oil-water heat exchanger. The water cooling loop and the oil cooling loop are not connected. The water cooling loop runs through an inverter, and runs through the oil-water heat exchanger after heat dissipation is performed on the inverter. The oil cooling loop is configured to cool a motor and a reducer. A coolant flow rate in this embodiment of this application is a coolant flow rate in the water cooling loop. A specific type of the coolant is not limited in this embodiment of this application. In some embodiments, the coolant may be a mixture of water and glycol.

In a possible implementation, the powertrain 1202 includes an inverter, a motor, an electronic pump, a first cooling loop, and a controller. Coolant in the first cooling loop is configured to cool the inverter. The electronic pump is configured to drive the coolant to circulate in the first cooling loop. The inverter is configured to convert a direct current provided by the power battery pack into an alternating current, and then provide the alternating current for the motor. When a phase current of the motor is greater than or equal to a preset current value, the controller determines a current coolant flow rate based on a current temperature at a first position in the first cooling loop, a current temperature at a second position in the inverter, and a power loss of the inverter, determines a coolant flow rate at a first moment as a first flow rate, and determines a rotation speed of the electronic pump at the first moment as a first rotation speed. When the phase current of the motor is less than the preset current value, the controller determines a current rotation speed of the electronic pump as a second rotation speed, and determines a current coolant flow rate based on the first rotation speed, the first flow rate, and the second rotation speed.

The powertrain can estimate the current coolant flow rate in real time. Data for estimating the current coolant flow rate, that is, the temperature at the first position, the temperature at the second position, the power loss of the inverter, the rotation speed of the electronic pump, and the like, is data that can be determined on a powertrain side. This avoids repeated calibration operations for different vehicle models, reducing time overheads and improving practicability of the solution. In addition, when the phase current of the motor is less than the preset current value, heat dissipation power consumption of the inverter is low; and impact of a relative error of temperature detection data is large. In this case, the current coolant flow rate is determined by using the coolant flow rate in the case of high heat dissipation power consumption of the inverter and the corresponding rotation speed of the electronic pump, and based on the current rotation speed of the electronic pump. This further improves accuracy of coolant flow rate estimation.

In another possible implementation, the powertrain 1202 includes an inverter, a motor, a first temperature sensor, a second temperature sensor, a first cooling loop, an electronic pump, and a controller. Coolant in the first cooling loop is configured to cool the inverter, the first temperature sensor is configured to detect a temperature at a first position in the inverter, and the second temperature sensor is configured to detect a temperature at a second position in the inverter. The electronic pump drives the coolant to circulate in the first cooling loop. When a phase current of the motor is greater than a preset current value, the controller determines a coolant flow rate in the first cooling loop based on a temperature at a first position, a temperature at a second position, a specific heat capacity of the coolant, density of the coolant, and a power loss of the inverter, determines a coolant flow rate at a first moment as a first flow rate, and determines a rotation speed of the electronic pump at the first moment as a first rotation speed. When the phase current of the motor is less than the preset current value, the controller determines a current rotation speed of the electronic pump as a second rotation speed, and determines a current coolant flow rate according to the first rotation speed, the first flow rate, and the second rotation speed.

In some other embodiments, the controller may also detect an electrical parameter of a power semiconductor device in the inverter, to determine temperature information of the first position in the inverter and the second position in the inverter. In this case, the foregoing first temperature sensor and second temperature sensor may not be disposed in the powertrain. This reduces hardware costs.

The current coolant flow rate can be estimated in real time by using the powertrain provided in this embodiment of this application. Data for estimating the current coolant flow rate, that is, the temperature at the first position, the temperature at the second position, the power loss of the inverter, the rotation speed of the electronic pump, the specific heat capacity of the coolant, the density of the coolant, and the like, is data that can be determined on a powertrain side. This avoids repeated calibration operations for different vehicle models, reducing time overheads and improving practicability of the solution. In addition, when the phase current of the motor is less than the preset current value, the current coolant flow rate is determined in the proportional scaling manner by using the coolant flow rate in the case of high heat dissipation power consumption of the inverter and the corresponding rotation speed of the electronic pump, and based on the current rotation speed of the electronic pump. This further improves accuracy of coolant flow rate estimation.

It should be understood that in this application, "at least one (item)" refers to one or more and "a plurality of" refers to two or more. "And/or" is used to describe an association relationship between associated objects, and indicates that three relationships may exist.

The foregoing descriptions are merely specific implementations of this application. It should be noted that a person of ordinary skill in the art may further make improvements and refinements without departing from the principles of this application. These improvements and refinements shall also fall within the protection scope of this application.

What is claimed is:

1. A powertrain, comprising:
an inverter, a motor, an electronic pump, a first cooling loop, and a controller, wherein;
coolant in the first cooling loop is configured to cool the inverter;
the electronic pump is configured to drive the coolant to circulate in the first cooling loop;
the inverter is configured to output an alternating current to the motor; and
in response to a phase current of the motor being greater than or equal to a preset current value, the controller is configured to determine a rotation speed of the electronic pump at a first moment as a first rotation speed, and determine a coolant flow rate at the first moment based on a temperature at a first position in the first cooling loop, a temperature at a second position in the inverter, and a power loss of the inverter; and
in response to the phase current of the motor being less than the preset current value, the controller is configured to determine a rotation speed of the electronic pump at a second moment as a second rotation speed and determine a coolant flow rate at the second moment based on the first rotation speed, the coolant flow rate at the first moment, and the second rotation speed.

2. The powertrain according to claim 1, wherein the controller is configured to determine thermal resistance between the first position and the second position based on the temperature at the first position, the temperature at the second position, and the power loss of the inverter; and
determine the coolant flow rate at the first moment based on a correspondence among the thermal resistance between the first position and the second position, the temperature at the first position, and the coolant flow rate.

3. The powertrain according to claim 1, wherein;
the first position is located at a coolant inlet in the first cooling loop; and
the second position is located at a position that is in the inverter close to a coolant inlet side of the first cooling loop, and the second position is aligned with the first position in a direction perpendicular to the first cooling loop.

4. The powertrain according to claim 1, wherein the controller is further configured to determine the power loss of the inverter based on a bus voltage of the inverter, an output alternating current of the inverter, an operating temperature of a power semiconductor device in the inverter, and a duty cycle of a control signal of the inverter.

5. The powertrain according to claim 1, wherein in response to the phase current of the motor being less than the preset current value, the controller is configured to determine the coolant flow rate at the second moment based on a ratio of the first rotation speed to the coolant flow rate at the first moment, and the second rotation speed, wherein a ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

6. The powertrain according to claim 5, wherein the controller comprises a register, and the controller is further configured to:
store a correspondence among the temperature at the first position, the second rotation speed, and the coolant flow rate at the second moment in the register; and
in response to the phase current of the motor being less than the preset current value again, determine a coolant flow rate at a third moment based on a temperature at the first position at the third moment, a rotation speed of the electronic pump at the third moment, and the correspondence among the temperature at the first position, the second rotation speed, and the coolant flow rate at the second moment.

7. The powertrain according to claim 5, wherein the powertrain further comprises a memory, and the controller is further configured to:
store a correspondence among the temperature at the first position, the second rotation speed, and the coolant flow rate at the second moment in the memory; and
in response to the phase current of the motor being less than the preset current value again, determine a coolant flow rate at a third moment based on a temperature at the first position at the third moment, a rotation speed of the electronic pump at the third moment, and the correspondence among the temperature at the first position, the second rotation speed, and the coolant flow rate at the second moment.

8. The powertrain according to claim 1, wherein the controller determines the temperature at the first position by using a first temperature sensor, or the controller determines the temperature at the first position based on temperature information sent by a vehicle control unit (VCU).

9. The powertrain according to claim 1, wherein the temperature at the second position is measured by using a temperature measurement device, and the temperature measurement device is either one of the following:
a thermistor or a second temperature sensor.

10. The powertrain according to claim 1, further comprising:
a current sensor that is configured to detect the phase current of the motor; and send a detection result to the controller.

11. A powertrain, comprising:
an inverter, a motor, an electronic pump, a first cooling loop, and a controller, wherein;
coolant in the first cooling loop is configured to cool the inverter;
the electronic pump is configured to drive the coolant to circulate in the first cooling loop;
the inverter is configured to output an alternating current to the motor; and
in response to a phase current of the motor being greater than a preset current value, the controller is configured to determine a rotation speed of the electronic pump at a first moment as a first rotation speed, and determine a coolant flow rate at the first moment based on a temperature at a first position in the inverter, a temperature at a second position in the inverter, a specific heat capacity of the coolant, density of the coolant, and a power loss of the inverter; and
in response to the phase current of the motor being less than the preset current value, the controller is configured to determine a rotation speed of the electronic pump at a second moment as a second rotation speed, and determine a coolant flow rate at the second moment based on the first rotation speed, the second rotation speed, and the coolant flow rate at the first moment.

12. The powertrain according to claim 11, wherein the first position is located at a position that is in the inverter and that is close to an inlet side of the first cooling loop and the second position is located at a position that is in the inverter that is close to an outlet side of the first cooling loop.

13. The powertrain according to claim 11, further comprising:
a first temperature sensor and a second temperature sensor,
wherein
the first temperature sensor is configured to determine the temperature at the first position in the inverter and the second temperature sensor is configured to determine the temperature at the second position.

14. The powertrain according to claim 11, wherein the controller is further configured to determine the power loss of the inverter based on a bus voltage of the inverter, an output alternating current of the inverter, an operating temperature of a power semiconductor device in the inverter, and a duty cycle of a control signal of the inverter.

15. The powertrain according to claim 11, wherein the controller determines the coolant flow rate at the second moment based on a ratio of the first rotation speed to the coolant flow rate at the first moment and the second rotation speed in response to the phase current of the motor being less than the preset current value, wherein a ratio of the second rotation speed to the coolant flow rate at the second moment is equal to the ratio of the first rotation speed to the coolant flow rate at the first moment, or there is a preset function relationship between the ratio of the second rotation speed to the coolant flow rate at the second moment and the ratio of the first rotation speed to the coolant flow rate at the first moment.

16. The powertrain according to claim 15, wherein the controller comprises a register, and the controller is further configured to:

store a correspondence among the temperature at the first position, the second rotation speed, and the coolant flow rate at the second moment in the register; and
in response to the phase current of the motor being less than the preset current value again, determine a coolant flow rate at a third moment based on a temperature at the first position at the third moment, a rotation speed of the electronic pump at the third moment, and the correspondence among the temperature at the first position, the second rotation speed, and the coolant flow rate at the second moment.

17. The powertrain according to claim 15, wherein the powertrain further comprises a memory, and the controller is further configured to:
store a correspondence among the temperature at the first position, the second rotation speed, and the coolant flow rate at the second moment in the memory; and
in response to the phase current of the motor being less than the preset current value again, determine a coolant flow rate at a third moment based on a temperature at the first position at the third moment, a rotation speed of the electronic pump at the third moment, and the correspondence among the temperature at the first position, the second rotation speed, and the coolant flow rate at the second moment.

18. The powertrain according to claim 11, further comprising:
a current sensor that is configured to detect the phase current of the motor, and send a detection result to the controller.

19. An electric vehicle, comprising:
a powertrain, wherein the powertrain comprises an inverter, a motor, an electronic pump, a first cooling loop, and a controller, and wherein:
coolant in the first cooling loop is configured to cool the inverter;
the electronic pump is configured to drive the coolant to circulate in the first cooling loop;
the inverter is configured to output an alternating current to the motor; and
in response to a phase current of the motor being greater than or equal to a preset current value, the controller is configured to determine a rotation speed of the electronic pump at a first moment as a first rotation speed, and determine a coolant flow rate at the first moment based on a temperature at a first position in the first cooling loop, a temperature at a second position in the inverter, and a power loss of the inverter; and
response to the phase current of the motor being less than the preset current value, the controller is configured to determine a rotation speed of the electronic pump at a second moment as a second rotation speed, and determine a coolant flow rate at the second moment based on the first rotation speed, the coolant flow rate at the first moment, and the second rotation speed; and the electric vehicle further comprises a power battery pack,
wherein
the power battery pack is configured to supply electric energy to the powertrain; and
the powertrain is configured to convert the electric energy provided by the power battery pack into mechanical energy to drive the electric vehicle.

20. The electric vehicle according to claim 19, wherein the controller is configured to determine thermal resistance between the first position and the second position based on the temperature at the first position, the temperature at the second position, and the power loss of the inverter; and determine the coolant flow rate at the first moment based on a correspondence among the thermal resistance between the first position and the second position, the temperature at the first position, and the coolant flow rate.

* * * * *

UNITED STATES PATENT AND TRADEMARK OFFICE
CERTIFICATE OF CORRECTION

PATENT NO. : 12,212,266 B2
APPLICATION NO. : 17/858812
DATED : January 28, 2025
INVENTOR(S) : Wang et al.

Page 1 of 1

It is certified that error appears in the above-identified patent and that said Letters Patent is hereby corrected as shown below:

In the Claims

Claim 1, Column 31, Line 36: "loop, and a controller; wherein;" should read as -- loop, and a controller, wherein: --.

Claim 1, Column 31, Line 46: "electronic pump at a first moment as a first rotation speed," should read as -- electronic pump at a first moment as a first rotation speed --.

Claim 3, Column 32, Line 1: "The powertrain according to claim 1, wherein;" should read as -- The powertrain according to claim 1, wherein: --.

Claim 3, Column 32, Line 6: "loop, and the second position is aligned with the first" should read as -- loop and the second position is aligned with the first --.

Claim 11, Column 33, Line 8: "loop, and a controller, wherein;" should read as -- loop, and a controller, wherein: --.

Claim 19, Column 34, Line 49: "response to the phase current of the motor being less than" should read as -- in response to the phase current of the motor being less than --.

Signed and Sealed this
Twenty-second Day of July, 2025

Coke Morgan Stewart
*Acting Director of the United States Patent and Trademark Office*